US012575215B2

(12) United States Patent
Sayed et al.

(10) Patent No.: US 12,575,215 B2
(45) Date of Patent: Mar. 10, 2026

(54) OPTICAL DEVICE AND METHOD

(71) Applicant: KYOCERA SLD Laser, Inc., Goleta, CA (US)

(72) Inventors: Islam Sayed, Goleta, CA (US); Sang Ho Oh, Goleta, CA (US); Nathan Young, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 377 days.

(21) Appl. No.: 18/136,049

(22) Filed: Apr. 18, 2023

(65) Prior Publication Data

US 2023/0420587 A1     Dec. 28, 2023

Related U.S. Application Data

(60) Provisional application No. 63/356,225, filed on Jun. 28, 2022.

(51) Int. Cl.
| | |
|---|---|
| *H10F 77/14* | (2025.01) |
| *H10F 30/222* | (2025.01) |
| *H10F 71/00* | (2025.01) |
| *H10F 77/124* | (2025.01) |
| *H10F 77/169* | (2025.01) |

(52) U.S. Cl.
CPC ....... *H10F 77/1468* (2025.01); *H10F 30/222* (2025.01); *H10F 71/1274* (2025.01); *H10F 77/1243* (2025.01); *H10F 77/12485* (2025.01); *H10F 77/169* (2025.01)

(58) Field of Classification Search
CPC .. H10F 30/222; H10F 30/223; H10F 71/1274; H10F 77/1243; H10F 77/12485; H10F 77/146; H10F 77/1468; H10F 77/169; H10F 77/703
See application file for complete search history.

(56) References Cited

U.S. PATENT DOCUMENTS

| | | | | |
|---|---|---|---|---|
| 8,536,615 | B1 * | 9/2013 | Driscoll ............. | H01L 21/0237 |
| | | | | 257/101 |
| 2005/0056824 | A1 * | 3/2005 | Bergmann ............ | B82Y 20/00 |
| | | | | 257/14 |
| 2015/0140710 | A1 * | 5/2015 | McLaurin ................. | H01S 5/22 |
| | | | | 438/33 |
| 2015/0146756 | A1 * | 5/2015 | Kawaguchi ........... | B82Y 20/00 |
| | | | | 372/45.012 |
| 2019/0386178 | A1 * | 12/2019 | David ............... | H10H 20/8215 |

OTHER PUBLICATIONS

Helmers, H. et al., "68.9% Efficient GaAs-Based Photonic Power Conversion Enabled by Photon Recycling and Optical Resonance," *Phys. Status Solidi* RRL, (2021), 15, 2100113, 7 pages.

(Continued)

*Primary Examiner* — Andres Munoz
(74) *Attorney, Agent, or Firm* — Kilpatrick Townsend & Stockton LLP

(57) ABSTRACT

The present invention relates to techniques, including methods and devices, for optical technology. In particular, the present invention provides methods, devices, and structures for optical devices, and in particular, photo diodes, commonly called photo sensors.

20 Claims, 25 Drawing Sheets

(56)              References Cited

OTHER PUBLICATIONS

Fernández, E. F. et al., "Band-gap material selection for remote high-power laser transmission," *Solar Energy Materials & Solar Cells* 235 (2022), 111483, Accepted Nov. 2, 2021, 10 pages.

Algora, C. et al., "Beaming power: Photovoltaic laser power converters for power-by-light," *Joule* 6, pp. 340-368, Feb. 16, 2022.

De Santi, C. et al., "GaN-Based Laser Wireless Power Transfer System," *Materials*, (2018), 11, 13 pages; published Jan. 17, 2018.

Komuro, Y. et al., "A 43.0% efficient GaInP photonic power converter with a distributed Bragg reflector under high-power 638 nm laser irradiation of 17 W $cm^{-2}$," *Applied Physics Express*, 14, 052002, (2021), 6 pages; published online Apr. 15, 2021.

Park, J. Y. et al., "Subwavelength-scale nanorods implemented hexagonal pyramids structure as efficient light-extraction in Light-emitting diodes," *Scientific Reports*, (2020), 10:5540, 7 pages.

* cited by examiner

First upper barrier design

Example 1: Abrupt potential barrier using GaN

Example 2: Graded potential barrier using InGaN

Example 3: Abrupt potential using GaN barrier + Graded potential barrier using InGaN Example 4: Graded potential barrier using InGaN +abrupt potential using GaN barrier Absorbing Region

FIGURE 9

Nano-masks

Dry etch

FIGURE 22

Dry etch

OPTICAL DEVICE AND METHOD

CROSS-REFERENCES TO RELATED APPLICATIONS

This present application claims priority to U.S. Ser. No. 63/356,225 filed Jun. 28, 2022, commonly assigned, and hereby incorporated by reference in its entirety.

BACKGROUND

The present invention relates to techniques, including methods and devices, for optical technology. In particular, the present invention provides methods, devices, and structures for optical devices, and in particular, photo diodes, commonly called photo sensors.

A solid-state photodiode is a semiconductor device that converts light into an electrical signal. It is made of a p-n junction with a depletion region that generates a current when light is absorbed by the device. The current produced by the photodiode is proportional to the intensity of the incident light.

The first solid-state photodiode was invented in 1951 by Calvin Fuller and Gerald Pearson of Bell Labs. They used a p-n junction made of germanium to create a device that could detect infrared radiation. Since then, solid-state photodiodes have become an essential component in many electronic devices.

Solid state photodiodes have a wide range of applications, including photonic power converters and optical communication. In fiber optic communication systems, photodiodes are used to detect light signals and convert them into electrical signals. Additionally, photodiodes are commonly used in imaging applications, such as in digital cameras, where they detect light to create images in various formats. In the field of power conversions, photodiodes are utilized in the form of solar cells, which convert light into electrical energy. Solid state photodiodes are also gaining interest as power converters for monochromatic laser light.

However, solid-state photodiodes, also known as laser power converters, have some limitations. One of their limitations is their limited sensitivity or power conversion efficiency to certain wavelengths of light, which reduces their effectiveness for some applications. Moreover, the power conversion efficiency of photodiodes is affected by temperature, so they may need to be cooled for some applications. Furthermore, photodiodes can be susceptible to noise, which can reduce their accuracy.

From the above, it is seen that improved photodiodes are still desirable.

SUMMARY

According to the present invention, techniques related to methods and devices for optical technology are provided. In particular, the present invention provides methods, devices, and structures for optical devices, and in particular, photo diodes, commonly called photo sensors.

In an example, the present invention provides an optical device. The optical device has a gallium and nitrogen containing substrate member having a backside surface and an upper surface. The device has an N-type gallium and nitrogen containing material having a silicon dopant overlying the upper surface, the N-type gallium and nitrogen containing material being configured as a buffer material. In an example, the buffer material has a thickness ranging from about 0.5 micrometer to one and a half micrometer. The device has a super lattice (SL) indium gallium nitrogen as a defect mitigation layer containing material overlying the N-type gallium and nitrogen containing material. The super lattice layer comprises an indium gallium nitrogen containing material and a gallium and nitrogen containing material. The super lattice layer is a periodic structure that has fifteen to eighty indium gallium nitrogen containing material and the gallium and nitrogen containing material. The device has a lower barrier (LB) indium gallium nitrogen containing material overlying the SL indium gallium nitrogen containing material. The LB material has an indium concentration ranging from zero to six percent. The LB material has a thickness ranging from 4 to 20 nanometers. In an example, the device has a plurality of quantum well regions ranging from 30 to 70 quantum wells overlying the LB indium gallium nitrogen containing material. Each of the quantum wells has an indium gallium nitride material having a thickness of 2.0 nanometers to 4.0 nanometers, and an indium concentration ranging from seven percent to 14 percent, and a gallium nitride material having a thickness of 1.0 nanometers to 2.5 nanometers. In an example, the plurality of quantum well regions are in an undoped state. The device has an upper barrier (UB 1) indium gallium nitrogen containing material overlying the plurality of quantum well regions. In an example, the indium gallium nitride has a concentration ranging from zero to four percent, and a thickness of 4 nanometers to 10 nanometers, but can have variations. The first upper barrier region comprises gallium nitrogen and/or indium gallium nitrogen containing materials. The potential barrier of first upper barrier could be abrupt or graded or a combination of abrupt and graded potentials. For the graded potential region of the first upper barrier design, the composition of the indium composition could vary from 2% to 13%.

In an example, the UB 1 material is in an undoped state. The device has an upper barrier (UB 2) gallium nitrogen containing material overlying the UB 1 material. The upper barrier gallium nitrogen containing material comprises a magnesium dopant material having a concentration of $8E19$ atoms/cm$^3$ to $6E20$ atoms/cm$^3$, and a thickness of sixteen nanometers to twenty-four nanometers. The device has a P-type gallium and nitrogen containing material overlying the UB 2 indium gallium nitrogen containing material. The P-type material is a cap material. In an example, the device has a P-type contact comprising gallium and nitrogen material having a magnesium dopant material. In an example, the P-type contact is in electrical and physical contact with the P-type gallium and nitrogen containing material.

In an example, the present invention provides an optical device. The device has a gallium and nitrogen containing substrate member having a backside surface and an upper surface. The device has an active region comprising a plurality of quantum well regions overlying the upper surface. The device has a plurality of hexagonal shaped pyramid structures spatially disposed along the backside surface. In an example, each of the hexagonal shaped pyramid structures has a height ranging from about 0.3 micrometer to about 30 micrometers, and a base ranging from about 0.3 micrometer to 30 micrometer. In an example, each of the hexagonal shaped pyramid structures extends from a crystalline structure of the gallium and nitrogen containing substrate member and has an irregularity in size ranging from 0% to 50%, but can be others. In an example, the device has an interior region (typically planar in shape) disposed between a pair of the plurality of hexagonal shaped pyramid structures. The device has a plurality of nanodots spatially disposed overlying the interior region and overlying a surface region of each of the hexagonal shaped pyramid structures and configured to direct electromagnetic radiation having a wavelength ranging from 390 to 460 nanometers the active region to increase an absorption of the radiation into the active region, and thereby coupling additional radiation into the active region.

Depending upon the example, the present invention can achieve one or more of these benefits and/or advantages. In an example, the present invention provides a novel photo diode device having improved features. In an example, the device is compact and spatially efficient. In an example, the present invention offers advantages of sensitive detection capabilities configured from an efficient size, weight, and cost using the present techniques. By utilizing these photo-diodes for optical energy conversion, various benefits can be achieved, including the avoidance of electromagnetic interference, immunity from electromagnetic noise, power beaming in free space, and providing a unique data transmission link when combined with optical communication. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

FIGS. 7 to 14 are simplified diagrams illustrating a method of fabricating a structure for light trapping configured on an optical device according to an example of the present invention.

FIGS. 15 to 24 are simplified diagrams illustrating a method of fabricating a structure for light trapping configured on an optical device according to an example of the present invention.

DETAILED DESCRIPTION

According to the present invention, techniques related to methods and devices for optical technology are provided. In particular, the present invention provides methods, devices, and structures for optical devices, and in particular, photo diodes, commonly called photo sensors. In an example, the invention provides a method for fabricating an optical device, e.g., photodiode. What follows is a general description of the typical configuration and fabrication of these devices.

Figure 1:
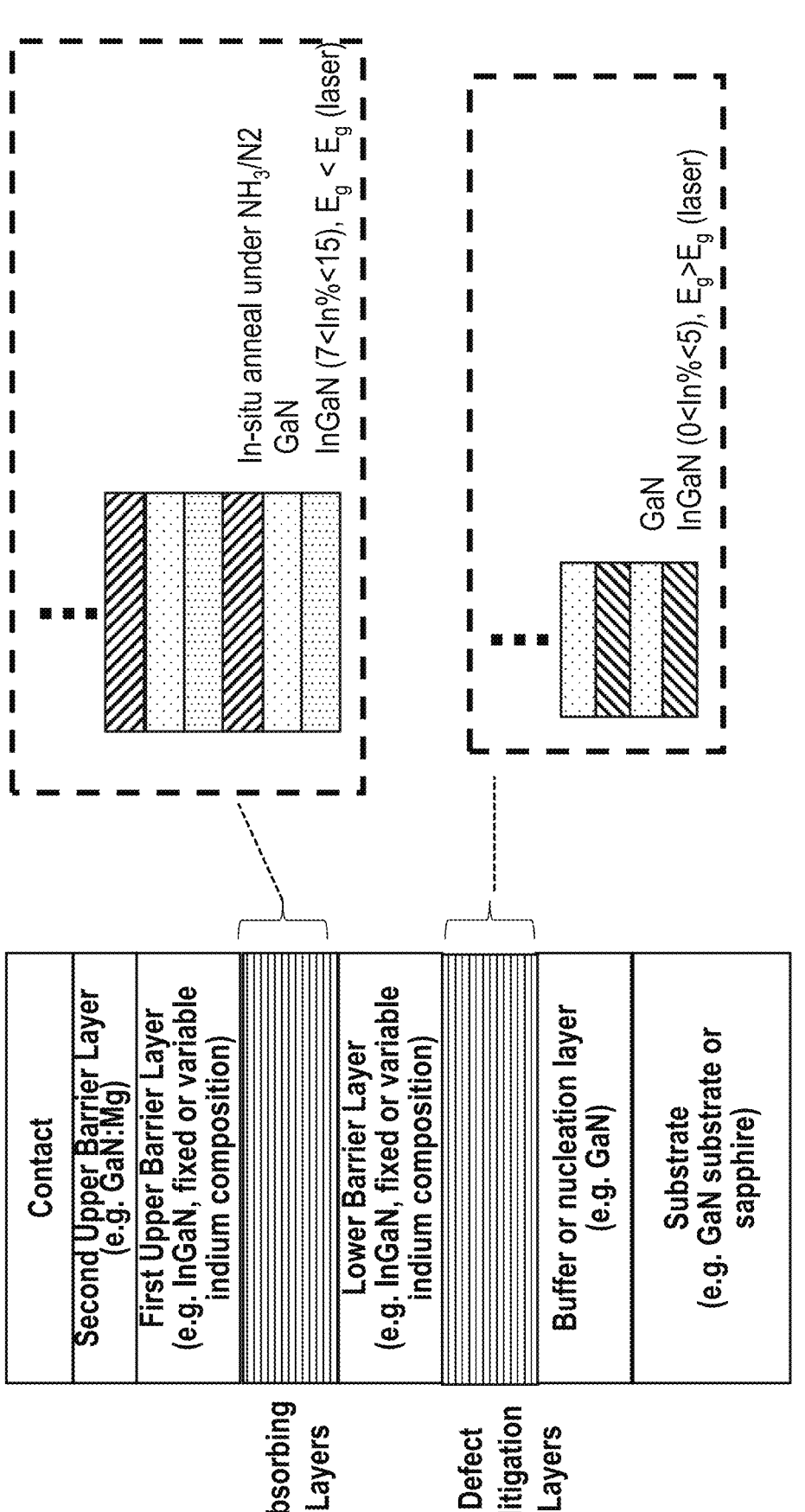
FIG. 1 is a simplified diagram illustrating a cross-sectional view of an optical device according to an example of the present invention.

FIG. 1 is a simplified diagram illustrating a cross-sectional view of an optical device according to an example of the present invention. As shown is an epitaxial structure overlying a gallium and nitrogen containing substrate, e.g., GaN. The cross-sectional view includes the substrate, e.g., GaN, sapphire. Overlying a surface region of the substrate is a buffer region and/or nucleation region. In an example, the buffer region or nucleation region can include a gallium nitride material. The gallium nitride material is epitaxially grown using a trimethylgallium and ammonia ($NH_3$) gas reactant and a metal organic chemical vapor deposition process, although there can be variations.

A plurality of defect mitigation regions are formed overlying the buffer region and/or nucleation region. The defect mitigation regions include a sequence of periodic structure made of indium gallium nitride regions overlying a gallium nitride region, as shown. The defect mitigation regions may include a periodic structure that has fifteen to eighty indium gallium nitrogen containing material and the gallium and nitrogen containing material. In an example, the indium gallium nitride region has a concentration of indium ranging from 0 to 3% and thickness ranging from 1 to 2.5 nm. The gallium nitride region in the superlattice typically has a thickness ranging from 1 to 3 nm. In an example, the thickness of one period from each defect mitigation region range can range from 2 to 5.5 nm.

The epitaxial structure includes a lower barrier region. The lower barrier region is typically an indium gallium nitride region, which has a fixed or varying concentration of indium entities within the lower barrier region. In an example, the thickness of the lower barrier region ranges from 6 to 20 nm.

In an example, the epitaxial structure includes a plurality of absorbing regions. As shown, the absorbing regions includes a sequential stack of indium gallium nitride material, a gallium nitride material, and a region of gallium nitride annealed under ammonia and nitrogen gas, as shown. The sequential stack is repeated 30 to 70 times and has an overall thickness ranging from 140 to 350 nm.

In an example, the epitaxial stack includes a first upper barrier region and an overlying second upper barrier region. A contact region is overlying the second upper barrier region, as shown. In an example, the upper barrier region can include a fixed or varying concentration of indium material, as shown. In an example, a thickness of the first upper barrier region ranges from 2 nm to 10 nm, and a thickness of the second upper barrier region ranges from 10 to 30 nm. Further details of various device structures can be found throughout the present specification and more particularly below.

In an example, the present invention provides an optical device. The optical device has a gallium and nitrogen containing substrate member having a backside surface and an upper surface. The device has an N-type gallium and nitrogen containing material having a silicon dopant overlying the upper surface, the N-type gallium and nitrogen containing material being configured as a buffer material. In an example, the buffer material has a thickness ranging from about 0.5 micrometer to one and a half micrometer. The device has a super lattice (SL) indium gallium nitrogen containing material overlying the N-type gallium and nitrogen containing material. The super lattice layer comprises an indium gallium nitrogen containing material and a gallium and nitrogen containing material. The super lattice layer is a periodic structure that has fifteen to eighty indium gallium nitrogen containing material and the gallium and nitrogen containing material. The device has a lower barrier (LB) indium gallium nitrogen containing material overlying the SL indium gallium nitrogen containing material. The LB material has an indium concentration ranging from zero to four percent. The LB material has a thickness ranging from 6 to 14 nanometers. In an example, the device has a plurality of quantum well regions ranging from 30 to 70 quantum wells overlying the LB indium gallium nitrogen containing material. Each of the quantum wells has an indium gallium nitride material having a thickness of 2.0 nanometers to 4.0 nanometers, and an indium concentration ranging from seven percent to 14 percent, and a gallium nitride material having a thickness of 1.0 nanometers to 2.5 nanometers. In an example, the plurality of quantum well regions are in an undoped state. The device has an upper barrier (UB 1 or first upper barrier region) indium gallium nitrogen containing material overlying the plurality of quantum well regions. In an example, the indium gallium nitride has a concentration ranging from zero to four percent, and a thickness of 4 nanometers to 10 nanometers, although there can be variations. The first upper barrier region comprises gallium nitrogen and/or indium gallium nitrogen containing materials. The potential barrier of first upper barrier could be abrupt or graded or a combination of abrupt and graded potentials. For the graded potential region of the first upper barrier design, the composition of the indium composition could vary from 2% to 13%, although there can be others.

In an example, the UB 1 material is in an undoped state. The device has an upper barrier (UB 2) gallium nitrogen containing material overlying the UB 1 material. The upper barrier gallium nitrogen containing material comprises a magnesium dopant material having a concentration of 8E19 atoms/cm$^3$ to 6E20 atoms/cm$^3$, and a thickness of sixteen nanometers to twenty-four nanometers. The device has a P-type gallium and nitrogen containing material overlying the UB 2 indium gallium nitrogen containing material. The P-type material is a cap material. In an example, the device has a P-type contact comprising gallium and nitrogen material having a magnesium dopant material. In an example, the P-type contact is in electrical and physical contact with the P-type gallium and nitrogen containing material.

In an alternative example, the present invention provides a photo diode or a photodetector device. The device has a gallium and nitrogen containing substrate member having a backside surface and an upper surface. The device has an N-type gallium and nitrogen containing material having a silicon dopant overlying the upper surface. In an example, the N-type gallium and nitrogen containing material is configured as a buffer material, which has a thickness ranging from about 0.5 micrometer to one and a half micrometer. In an example, the device has a super lattice (SL) indium gallium nitrogen containing material overlying the N-type gallium and nitrogen containing material. The super lattice layer comprises an indium gallium nitrogen containing material and a gallium and nitrogen containing material. The super lattice material has fifteen to eighty indium gallium nitrogen containing material and the gallium and nitrogen containing material. In an example, the device has a lower barrier (LB) indium gallium nitrogen containing material overlying the SL indium gallium nitrogen containing material. The LB material has an indium concentration ranging from zero to four percent and has a thickness ranging from 8 to 12 nanometers. In an example, the device has a plurality of quantum well regions ranging from 30 to 70 quantum wells overlying the LB indium gallium nitrogen containing material. Each of the quantum wells has an indium gallium nitride material having a thickness of 2.5 nanometers to 3.5 nanometers, and an indium concentration ranging from seven percent to 14 percent, and a gallium nitride material having a thickness of 1.5 nanometers to 2.5 nanometers. In an example, the plurality of quantum well regions are in an undoped state. In an example, the device has an upper barrier (UB 1) indium gallium nitrogen containing material overlying the plurality of quantum well regions.

In an example, the first upper barrier region (UB 1) comprises gallium nitrogen and/or indium gallium nitrogen containing materials. The potential barrier of first upper barrier could be abrupt or graded or a combination of abrupt and graded potentials. For the graded potential region of the first upper barrier design, the composition of the indium composition could vary from 2% to 13%.

In an example, the upper barrier material is in an undoped state. In an example, the device has an upper barrier (UB 2) gallium nitrogen containing material overlying the UB 1 layer. The upper barrier gallium nitrogen containing material comprises a magnesium dopant material having a concentration 8E19 atoms/cm$^3$ to 6E10 atoms/cm$^3$, and a thickness of sixteen nanometers to twenty-four nanometers. In an example, the device has a P-type gallium and nitrogen containing material overlying the UB 2 indium gallium nitrogen containing material, the P-type material being a cap material and a P-type contact comprising gallium and nitrogen material having a magnesium dopant material. The P-type contact is in electrical and physical contact with the P-type gallium and nitrogen containing material.

In an example, the silicon dopant in the buffer region comprises a concentration ranging from 1E18 atoms/cm$^3$ to 8E18 atoms/cm$^3$. In an example, the SL indium gallium nitrogen containing material comprises a silicon dopant having a concentration ranging from 1E18 to 5E18 atoms/cm$^3$. In an example, the LB indium gallium nitrogen containing material comprises a silicon dopant having a concentration ranging from 1E19 to 8E19 atoms/cm$^3$. In an example, each of the quantum well regions comprise multiple quantum well regions.

In an example, the backside surface is an aperture region. In an example, the device also has a first metal material connected to the P-type contact and a second metal material connect to the N-type gallium and nitrogen containing material. In an example, the gallium and nitrogen containing substrate having the upper surface with a miscut ranging from 0.2 to 1 Degrees toward m-plane axis. Further details of the present techniques can be found throughout the present specification and more particularly below.

Figure 2:
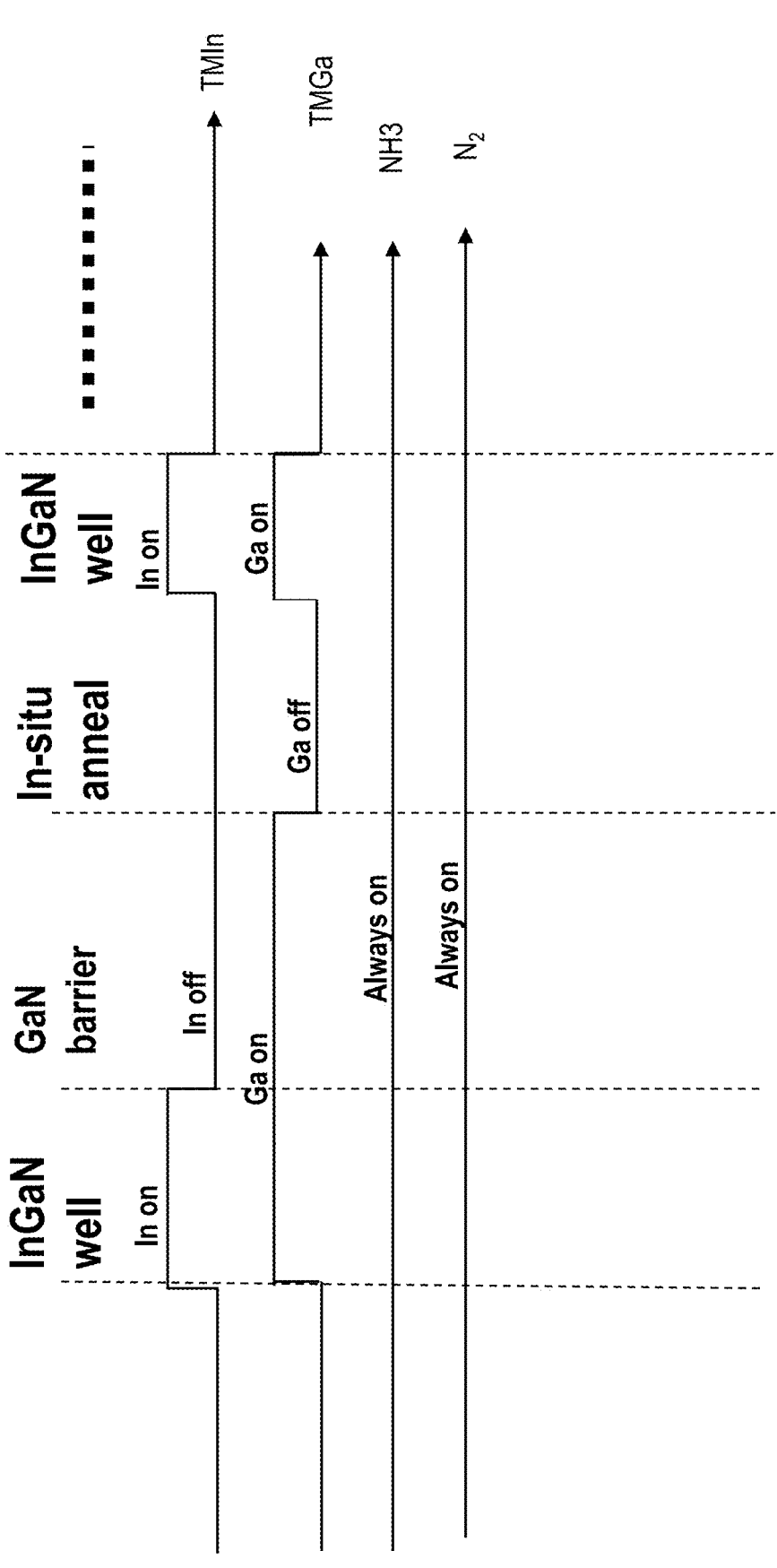
FIG. 2 is a simplified diagram of gas flow for formation of an active region in an optical device according to an example of the present invention.

FIG. 2 is a simplified diagram of gas flow for formation of an active region in an optical device according to an example of the present invention. As shown, nitrogen, N$_2$, flow is on through formation of the InGaN well, GaN barrier, In-situ anneal, and InGaN well regions, as shown. Ammonia gas is also in an on state. In an example, certain gases introducing gallium species and indium species are introduced, stopped, or ramped, as shown.

In an example, the formation occurs using epitaxial growth in which a thin film of a crystalline material is deposited on a substrate, such that the crystal structure of the film matches that of the substrate. In an example, Metal-Organic Chemical Vapor Deposition (MOCVD) is a common technique for such epitaxial growth of gallium nitride (GaN) and indium gallium nitride (InGaN) films.

In the MOCVD process, precursor gases containing metal and nitrogen are introduced into a reaction chamber, where they react at high temperatures and pressures to form the desired thin film. For GaN and InGaN epitaxial growth, commonly used precursor gases include trimethylgallium (TMG), trimethylindium (TMI), ammonia ($NH_3$), and nitrogen (N2).

During the MOCVD process, the substrate is heated to a high temperature, typically in the range of 800-1100° C., and the precursor gases are introduced into the reaction chamber. The gases react and deposit onto the substrate surface, forming a thin film. The growth rate and properties of the film can be controlled by adjusting the temperature, pressure, and gas flow rates.

In the case of InGaN films, the composition of the film can be tuned by adjusting the flow rates of the precursor gases. By varying the ratio of TMI and TMG, the indium content in the film can be varied, resulting in a range of optical and electronic properties. Further details of the present techniques can be found throughout the present specification and more particularly below.

Figure 3:
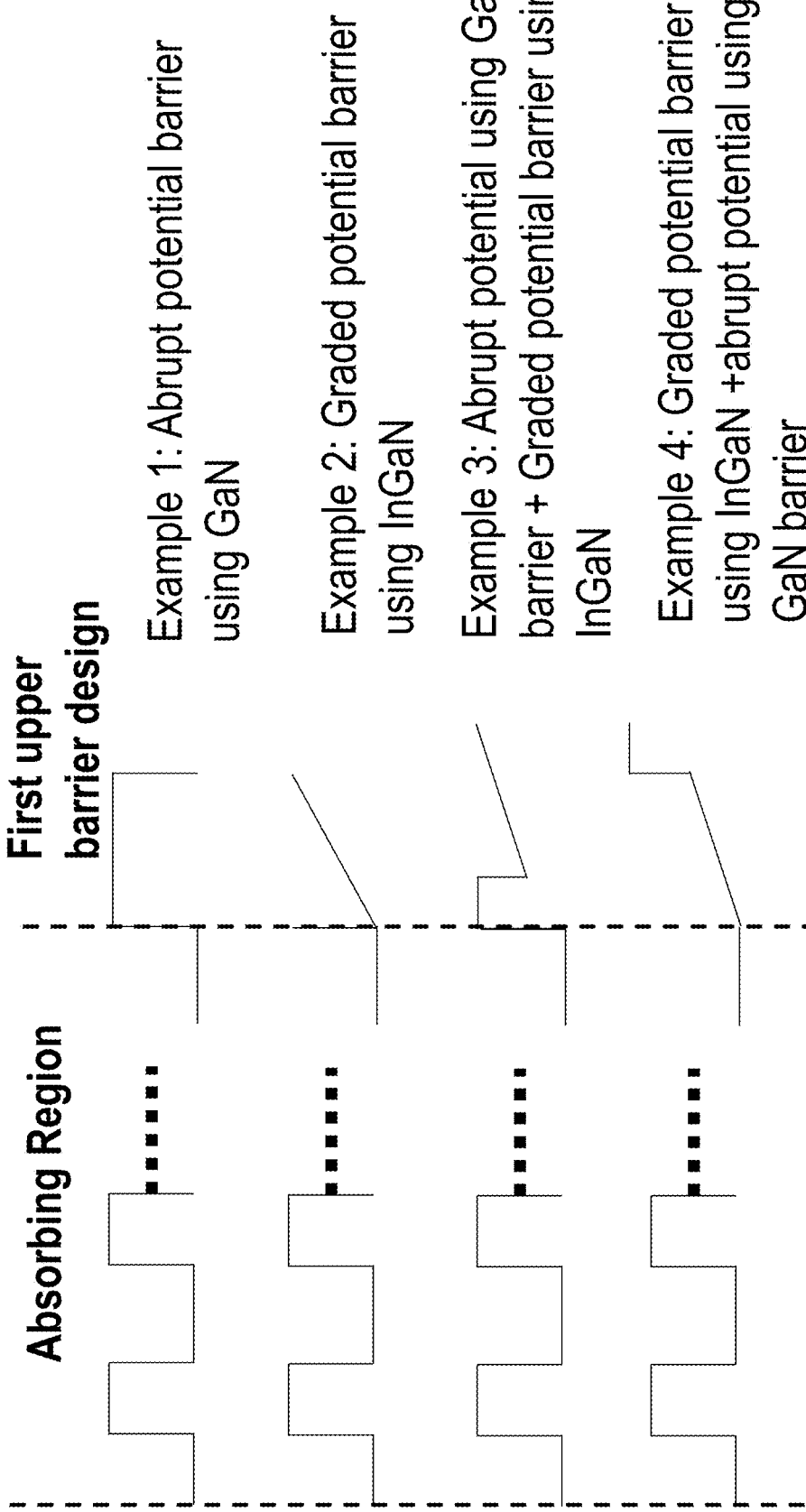
FIG. 3 is a simplified diagram of different energy band regions of an upper barrier region of an optical device according to an example of the present invention.

FIG. 3 is a simplified diagram of different energy band regions of an upper barrier region of an optical device according to an example of the present invention. As shown, a varying energy band is illustrating in an absorber region. In the first upper barrier region, the potential can be abrupt, which increases in a step function, flattens, and decreases in a step function, as in a first example. In a second example, the potential can increase linearly, in a third example, the potential can increase in a step, and then linearly. In an example 4, the potential can increase linearly, and then abruptly in a step function. Of course, one of ordinary skill in the art would recognize other variations, and combinations of the above.

Figure 4:
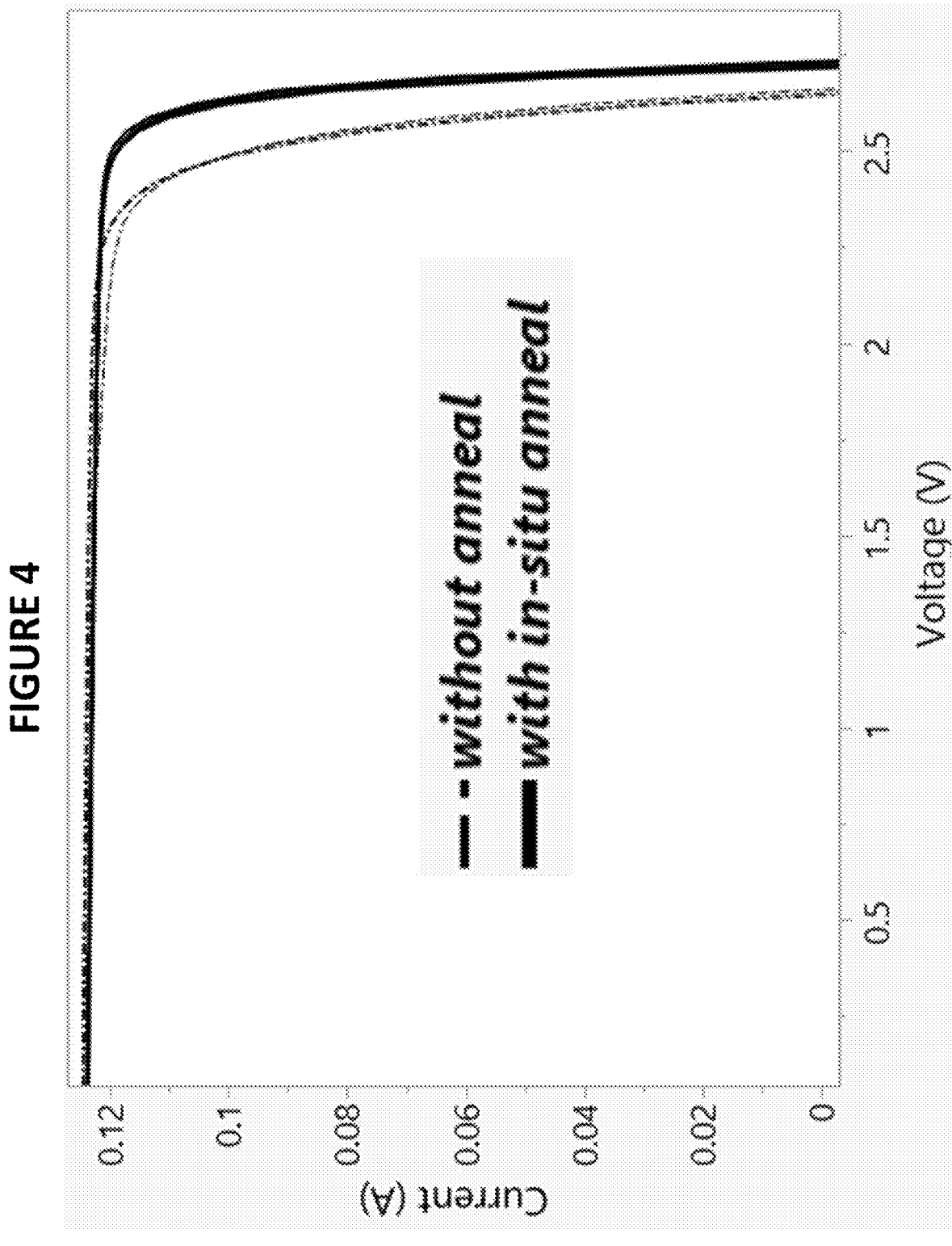
FIG. 4 is a simplified diagram of current plotted against voltage of various photodiode devices according to examples of the present invention.

FIG. 4 is a simplified diagram of current plotted against voltage of various photodiode devices according to examples of the present invention. As shown, with the in-situ anneal in the aforementioned techniques, we have demonstrated that voltage increases with the anneal and fill factor increases with the anneal as described to improve characteristics of the photodiode devices.

Figure 5:
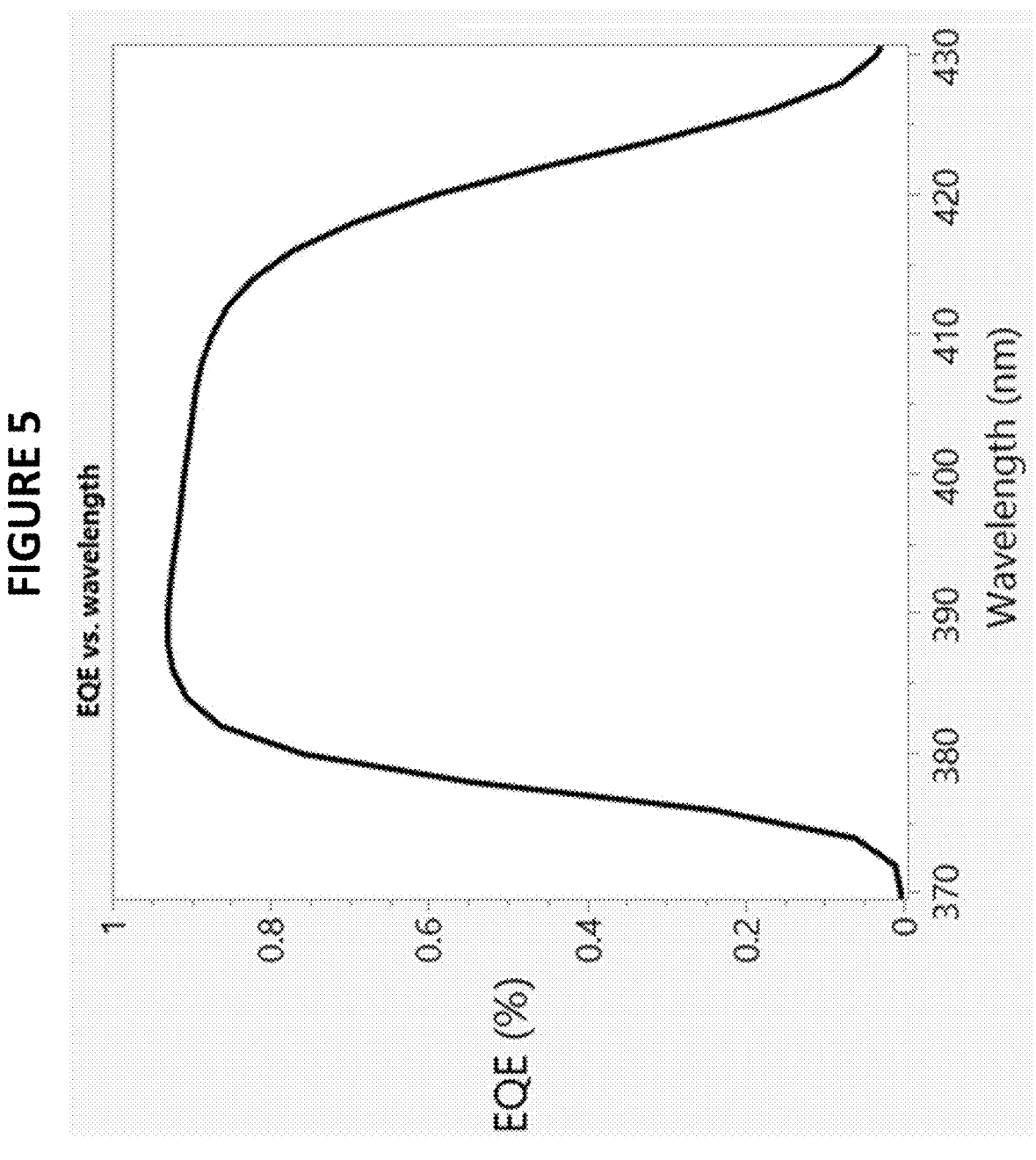
FIG. 5 is a simplified diagram of external quantum efficiency ("EQE") plotted against wavelength for a photodiode device according to an example of the present invention.

FIG. 5 is a simplified diagram of external quantum efficiency (EQE) plotted against wavelength for a photodiode device according to an example of the present invention. As shown, we have demonstrated device performance of EQE higher than 80% across the 380-420 nm wavelength range.

Figure 6:
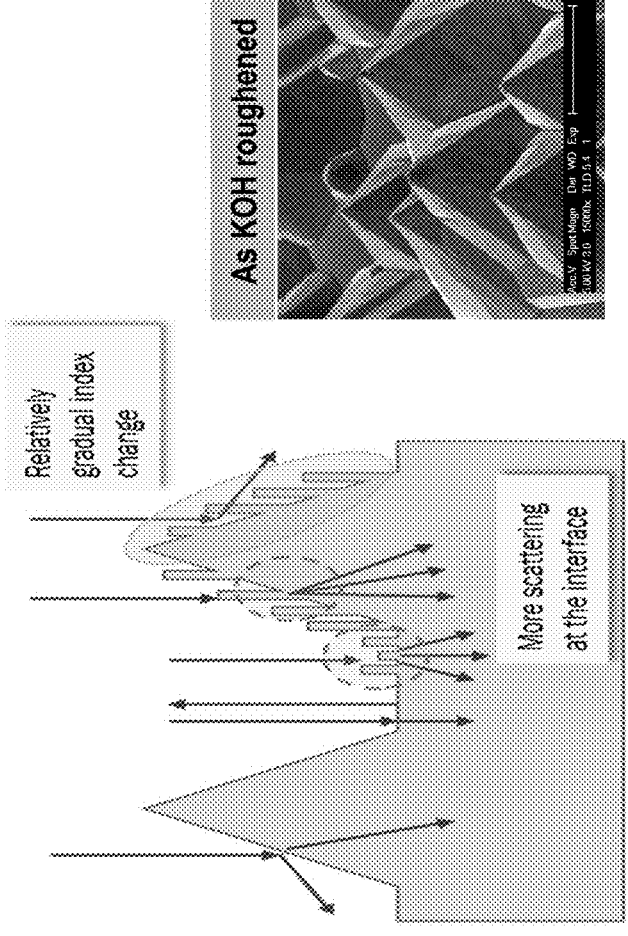
FIG. 6 is a simplified diagram of a structure for light trapping configured on an optical device according to an example of the present invention.

FIG. 6 is a simplified diagram illustrating a structure for light trapping configured on an optical device according to an example of the present invention. As shown is a micro-image of a textured surface region, including nanodots and hexagonal pyramidal structures without nanodots. As also described below is a technical description of a device and related method according to an example of the present invention.

In an example, the present invention provides an optical device, e.g., photodiode device. The device has a gallium and nitrogen containing substrate member having a backside surface and an upper surface. The device has an active region comprising a plurality of quantum well regions overlying the upper surface. In an example, the device has a plurality of hexagonal shaped pyramid structures spatially disposed along the backside surface. Each of the hexagonal shaped pyramid structures has a height ranging from about 0.3 micrometer to about 30 micrometers, and a base ranging from about 0.3 micrometer to 30 micrometer. Each of the hexagonal shaped pyramid structures extends from a crystalline structure of the gallium and nitrogen containing substrate member and has an irregularity in size ranging from 0% to 50%. In an example, the device has an interior region disposed between a pair of the plurality of hexagonal shaped pyramid structures. The device has a plurality of nanodots spatially disposed overlying the interior region and overlying a surface region of each of the hexagonal shaped pyramid structures and configured to direct electromagnetic radiation having a wavelength ranging from 390 to 450 nanometers the active region to increase an absorption of the radiation into the active region, and thereby coupling additional radiation into the active region.

In an example, the plurality of hexagonal shaped pyramid structures comprises 50% to 100% of the backside surface, and the interior region comprises 50% to 100% of the backside surface. In an example, the plurality of hexagonal shaped pyramid structures is provided using a potassium hydroxide (KOH) etchant.

In an example, the plurality of nanodots comprises a size ranging in a nanoscale. In an example, the plurality of nanodots comprises a gallium nitride material and each of the nanodots having a feature size and a shape.

In an example, the electromagnetic radiation is derived from laser irradiation. In an alternative example, the electromagnetic radiation comprises laser radiation enters the substrate member through the backside surface or a side edge of the substrate member. In an example, the electromagnetic radiation has a wavelength of 390 to 460 nanometers.

In an example, the device further comprises a power conversion efficiency (PCE) ranging from 50 to 85 percent.

In an example, the device further comprises a light trapping region comprising the plurality of hexagonal shaped structures and the plurality of nanodots. In an example, the device further comprises a light trapping region comprising the plurality of hexagonal shaped structures and the plurality of nanodots is configured to maintain the electromagnetic radiation within the device and is configured as a light trapping cavity to prevent electromagnetic radiation from escaping the device.

In an example, the device further comprises a high reflectivity mirror coating overlying a light trapping region comprising a portion of the plurality of hexagonal shaped pyramid structure and a portion of the plurality of nanodots to enhance light trapping and prevent light escaping.

In an example, the plurality of nanodots overlying the hexagonal pyramids and interior area are configured to scatter an escaping electromagnetic radiation back to the device resulting in spatially uniform light absorption over a substantial area of the active regions.

In an example, the backside surface comprising the nanodots and the hexagonal shaped pyramid structures provides a non-abrupt change of a reflective index within a vicinity of a surface to improve or maximize a transmission of an incident laser radiation into the device and minimize or reduce a reflection back to an ambient space outside of the device. In an example, the backside surface comprising the nanodots and the hexagonal shaped pyramid structures is configured to scatter an incident laser radiation into multiple directions to cause in an enhanced light transmission at an incident surface.

In an alternative example, the present invention provides a photo diode device. The device has a gallium and nitrogen containing substrate member having a backside surface and an upper surface and an active region comprising a plurality of quantum well regions overlying the upper surface. The device has a plurality of hexagonal shaped pyramid structures spatially disposed along the backside surface, each of the hexagonal shaped pyramid structures having a height ranging from about 0.3 micrometer to about 30 micrometers, and a base ranging from about 0.3 micrometer to 30 micrometer. Each of the hexagonal shaped pyramid structures extends from a crystalline structure of the gallium and nitrogen containing substrate member and has an irregularity in size ranging from 0% to 50%. In an example, the device has an interior region disposed between a pair of the plurality of hexagonal shaped pyramid structures. The device has a plurality of nanodots spatially disposed overlying the interior region and overlying a surface region of each of the hexagonal shaped pyramid structures and configured to direct electromagnetic radiation having a wavelength ranging from 390 to 450 nanometers the active region to increase an absorption of the radiation into the active region, and thereby coupling additional radiation into the active region.

In an example, the plurality of hexagonal shaped pyramid structures comprises 50% to 100% of the backside surface, and the interior region comprises 50% to 100% of the backside surface. In an example, the plurality of hexagonal shaped pyramid structures is provided using a potassium hydroxide KOH etchant.

In an example, the plurality of nanodots comprises a size ranging in a nanoscale. In an example, the plurality of nanodots comprises a gallium nitride material and each of the nanodots having a feature size and a shape.

In an example, the electromagnetic radiation is derived from laser irradiation. In an example, the electromagnetic radiation comprises laser radiation enters the substrate member through the backside surface or a side edge of the substrate member. In an example, the electromagnetic radiation has a wavelength of 390 to 450 nanometers.

In an example, the device further comprises a power conversion efficiency (PCE) ranging from 50 to 85 percent.

In an example, the device further comprises a light trapping region comprising the plurality of hexagonal shaped structures and the plurality of nanodots. In an example, the light trapping region comprises the plurality of hexagonal shaped structures and the plurality of nanodots is configured to maintain the electromagnetic radiation within the device and is configured as a light trapping cavity to prevent electromagnetic radiation from escaping the device.

In an example, the device further comprises a high reflectivity mirror coating overlying a light trapping region comprising a portion of the plurality of hexagonal shaped pyramid structure and a portion of the plurality of nanodots to enhance light trapping and prevent light escaping.

In an example, the plurality of nanodots overlying the hexagonal pyramids and interior area is configured to scatter an escaping electromagnetic radiation back to the device resulting in spatially uniform light absorption over a substantial area of the active regions.

In an example, the backside surface comprising the nanodots and the hexagonal shaped pyramid structures provides a non-abrupt change of a reflective index within a vicinity of a surface to improve or maximize a transmission of an incident laser radiation into the device and minimize or reduce a reflection back to an ambient space outside of the device. In an example, the backside surface comprising the nanodots and the hexagonal shaped pyramid structures is configured to scatter an incident laser radiation into multiple directions to cause in an enhanced light transmission at an incident surface.

In an example, the present method includes the following steps for a process of forming a nano patterned GaN substrate with pyramidal structures configured with nano patterns.

1. Start;
2. Provide a GaN substrate with photodiode devices, including backside and frontside;
3. Polish a backside of the GaN substrate using chemical and/or mechanical polishing;
4. Form a plurality of hexagonal pyramid structures using selective etching of potassium hydroxide etchant to selectively form the hexagonal pyramid structures using preferential etching;
5. Expose the plurality of hexagonal pyramid structures, including base regions, and hexagonal pyramid structures;
6. Form a nano mask pattern overlying surfaces of the base regions and hexagonal pyramid structures;
7. Perform a dry etching process through the mask regions that expose GaN material to form a plurality of nanodot patterns on the exposed GaN material;
8. Remove the mask;
9. Yield a nanodot patterned GaN substrate, as shown; and
10. Perform other processes on the nano patterned GaN.

As shown, the above sequence of steps provides a method of forming a combination of hexagonal pyramid structures configured with a plurality of nanodot patterns, e.g., nano particles, on a gallium and nitrogen containing substrate member. The sequence of steps is illustrated by way of the specification and drawings. In particular, FIGS. 7 to 14 are simplified diagrams illustrating a method of fabricating a structure for light trapping configured on an optical device according to an example of the present invention.

Figure 7:
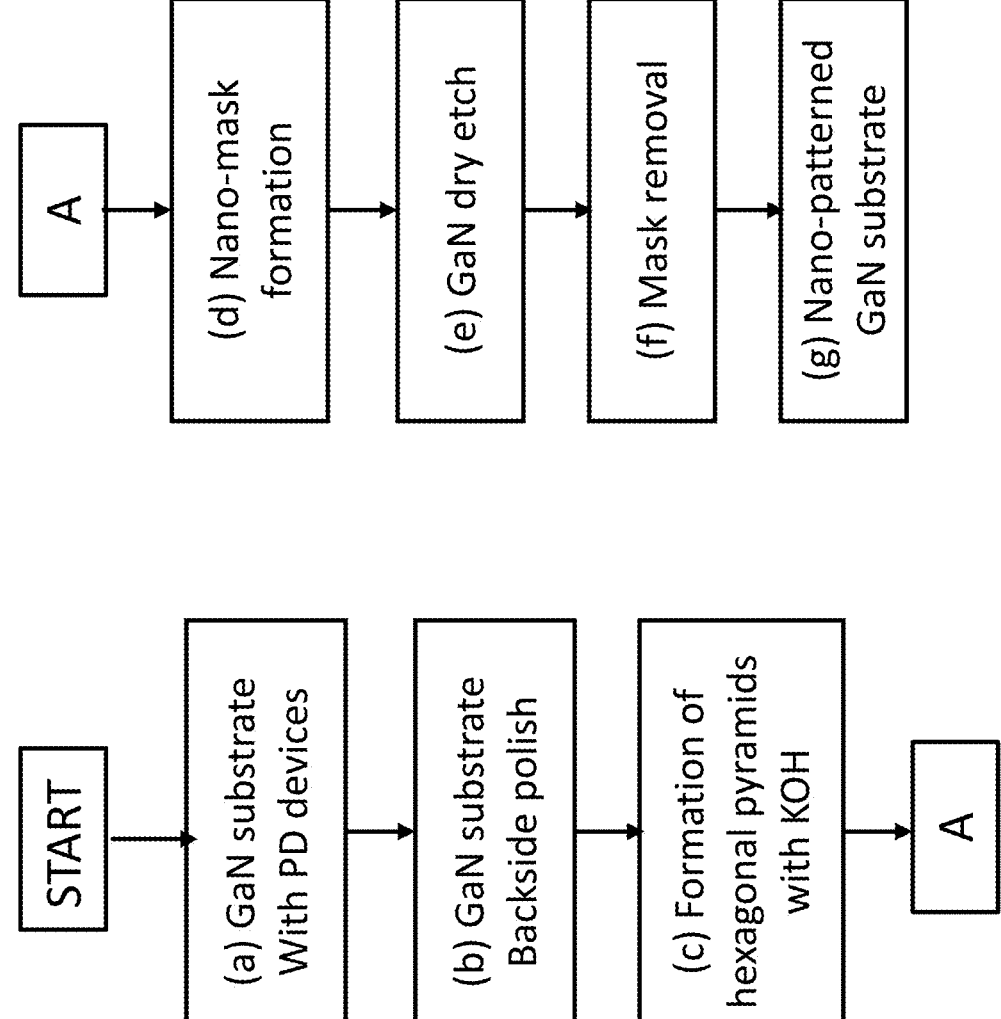

FIG. 7 is a simplified diagram of a generic process flow used to create nanodots on the surface with hexagonal pyramids. The generic flow includes providing a substrate member, e.g., a GaN substrate. The GaN substrate has a plurality of devices, e.g., photodiode devices, including backside and frontside. In an example, the flow includes polishing a backside of the GaN substrate using chemical and/or mechanical polishing. In an example, the polishing is performed using a combination of slurry and chemical species.

In an example, the flow includes forming a plurality of hexagonal pyramid structures using selective etching of potassium hydroxide (KOH) etchant to selectively form the hexagonal pyramid structures using preferential etching. That is, the selective etching uses a wet process with a solution of KOH, which selectively removes a portion of GaN along crystalline boundaries to create the hexagonal pyramid structures. In an example, the flow exposes the plurality of hexagonal pyramid structures, including base regions, and hexagonal pyramid structures, as further shown below.

In an example, the flow forms a nano mask pattern overlying surfaces of the base regions and hexagonal pyramid structures. The nano mask pattern blocks portions of the surface regions of the hexagonal pyramid structures and base regions. In an example, the flow performs a dry etching process through the mask regions that expose GaN material to form a plurality of nanodot patterns on the exposed GaN material. The flow removes the mask and produces a nanodot patterned on the GaN substrate, as shown. Of course, the flow also includes other processes on the nano patterned GaN. Further details of the various structures are shown below.

Figure 8:
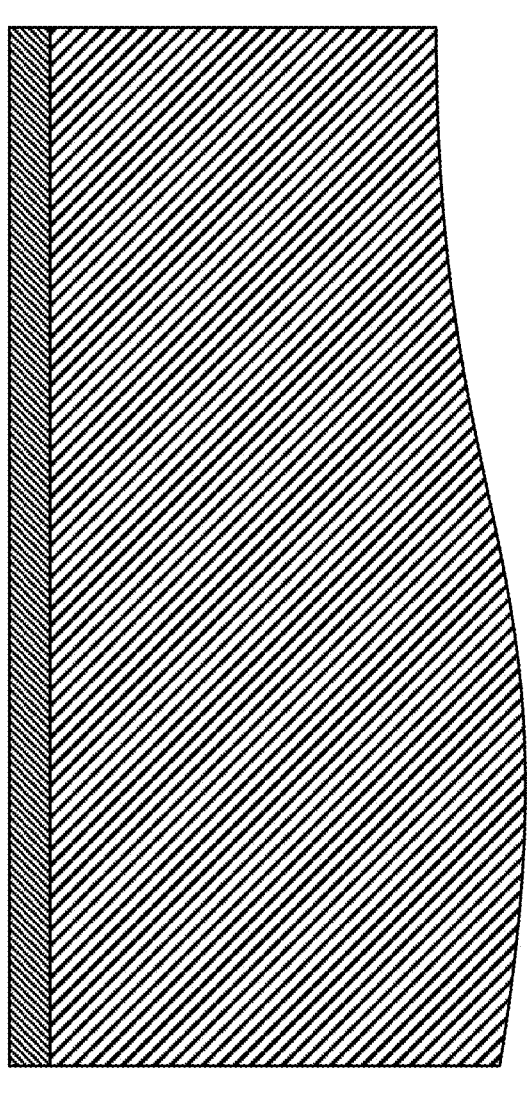
Figure 9:
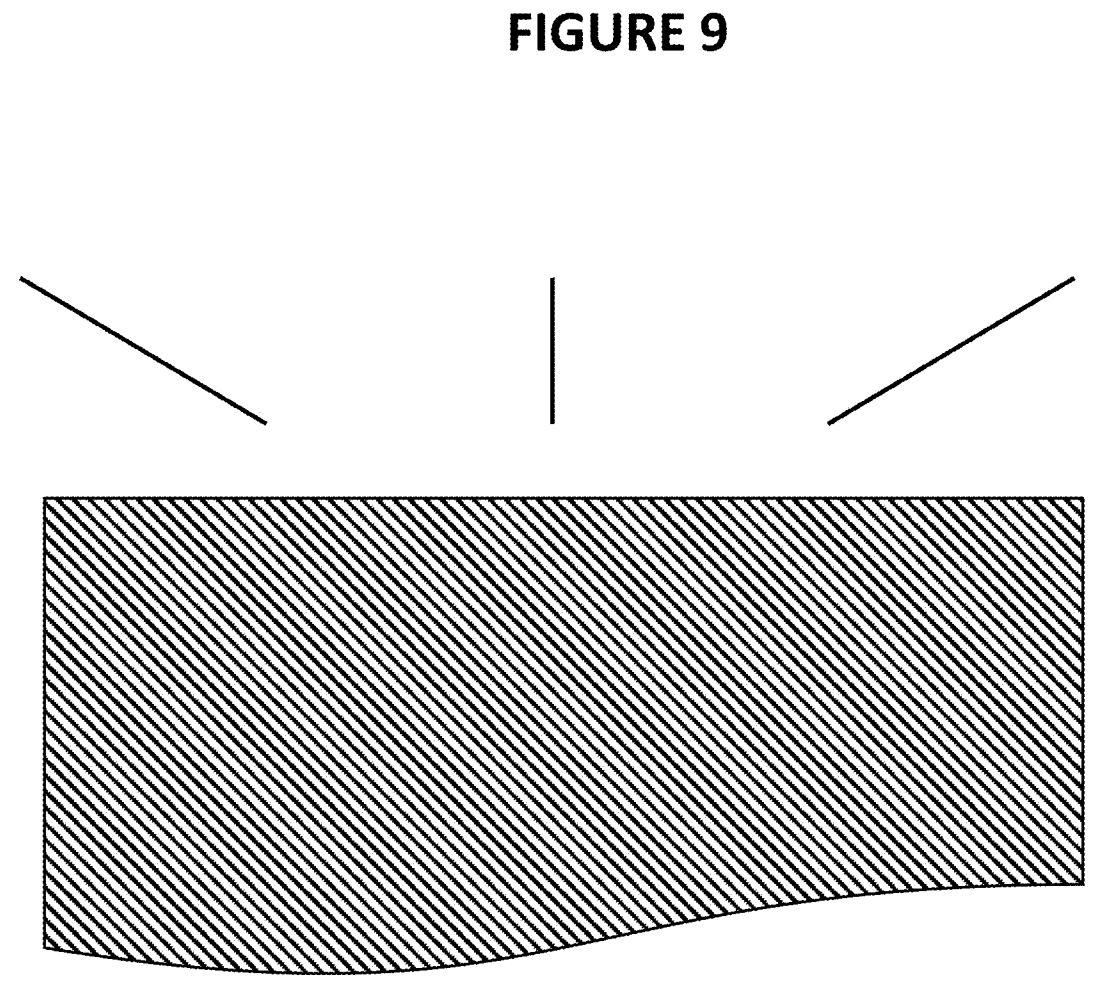
Figure 10:
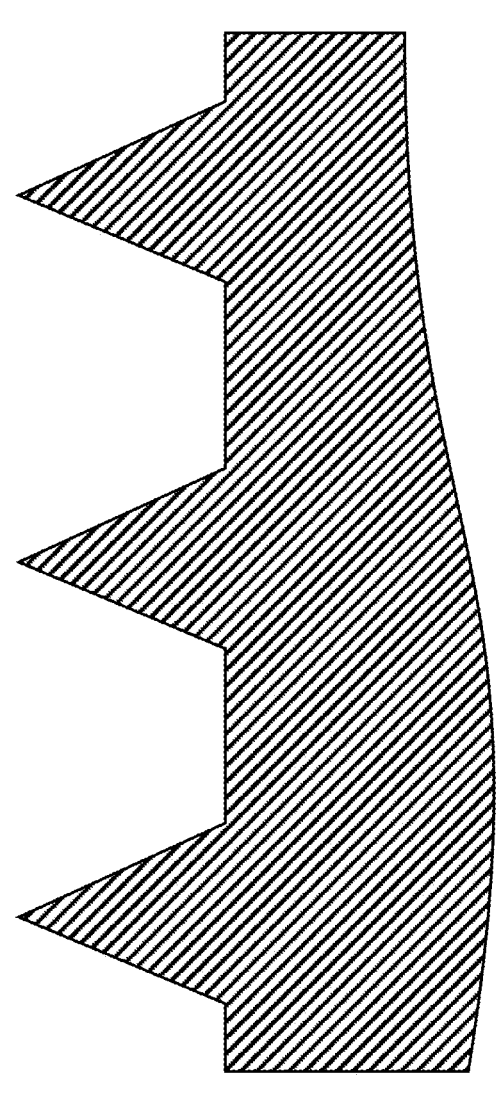
Figure 11:
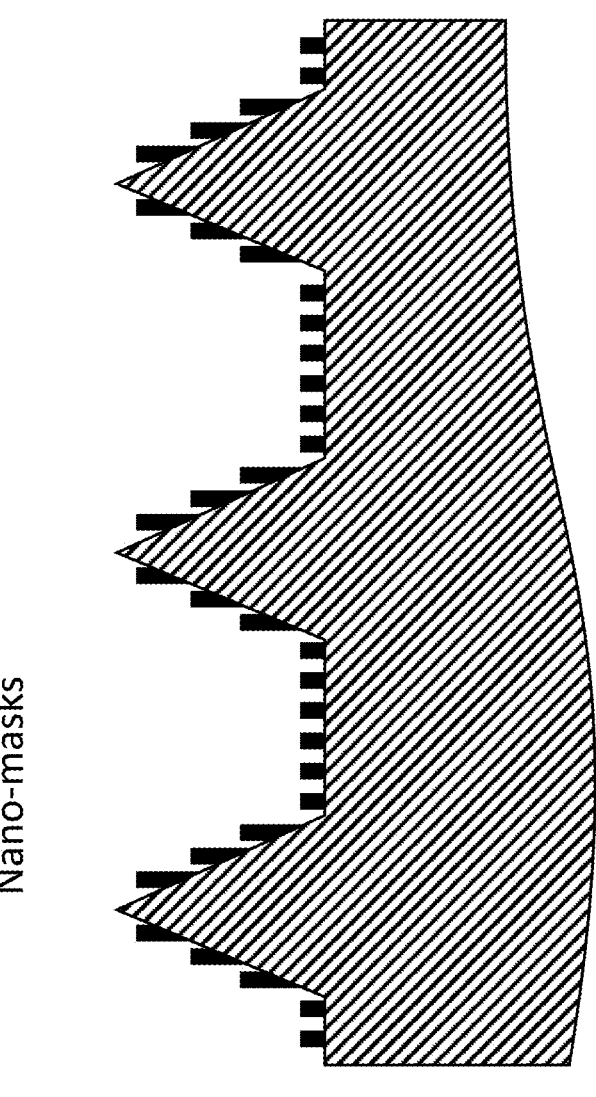
Figure 12:
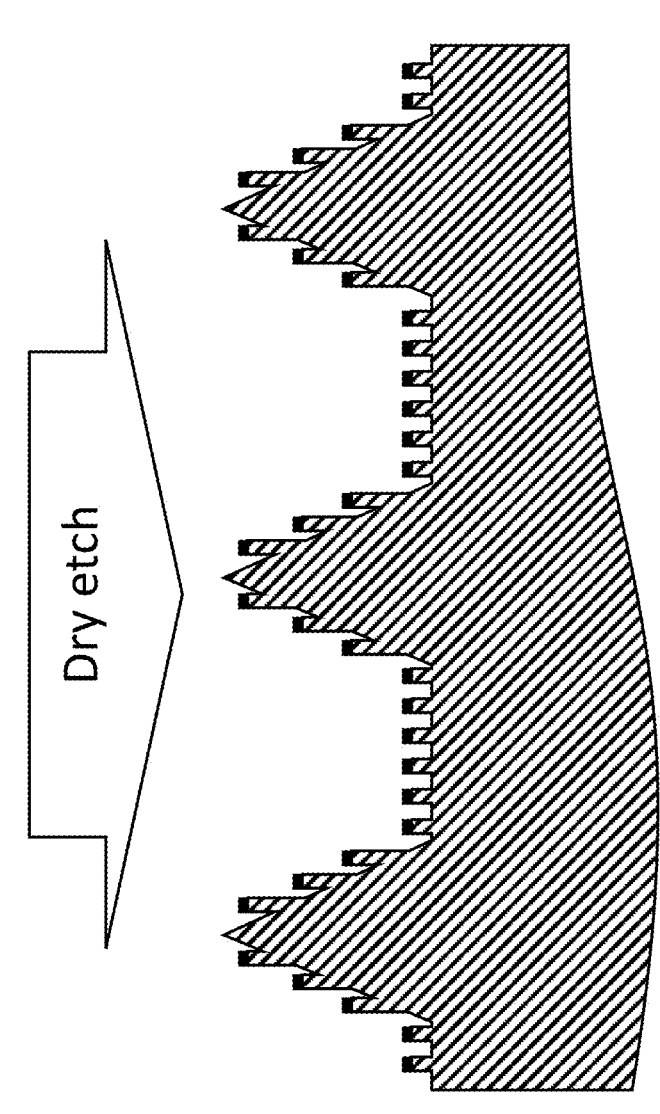
Figure 13:
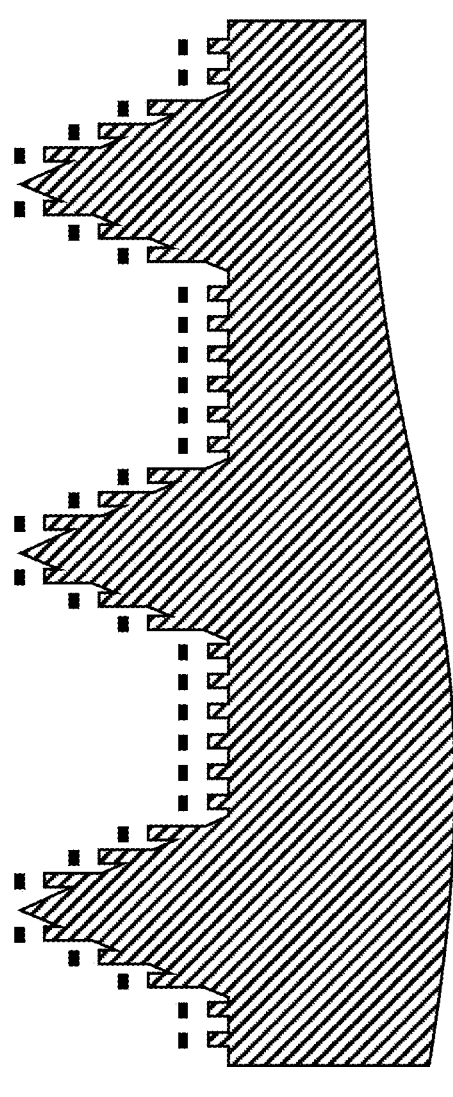
Figure 14:
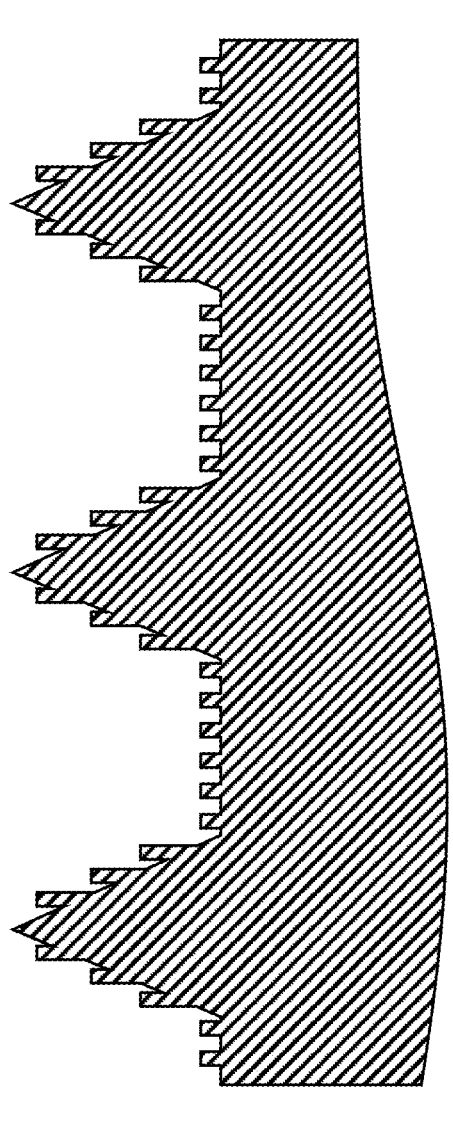

FIG. 8 is a simplified diagram of the backside of a GaN substrate with a layer of material that needs to be removed through the polishing process. FIG. 9 is a simplified diagram of a polished surface where the material thickness shown in FIG. 8 has been removed during the polishing step. FIG. 10 is a simplified diagram of hexagonal pyramid structures formed on the polished surface through wet etching using KOH solution. FIG. 11 is a simplified diagram of nanodot etch masks formed on the surface of hexagonal pyramid structures and flat area between the pyramid structures. FIG. 12 is a simplified diagram of the dry etch process used to create nanodots as defined by the nanodot masks. FIG. 13 is a simplified diagram of the mask removal process. FIG. 14 is a simplified diagram of the resulting backside surface obtained as a result of the process described in FIGS. 7-13.

In an example, the present method includes the following steps for a process of forming a nano patterned GaN substrate with pyramidal structures configured with nano patterns.

1. Start;
2. Provide a GaN substrate with photodiode devices, including backside and frontside;
3. Polish a backside of the GaN substrate using chemical and/or mechanical polishing;
4. Form a plurality of hexagonal pyramid structures using selective etching of potassium hydroxide etchant to selectively form the hexagonal pyramid structures using preferential etching;
5. Expose the plurality of hexagonal pyramid structures, including base regions, and hexagonal pyramid structures;
6. Form a silver (Ag) material using a deposition process;
7. Perform a chlorine plasma treatment process on exposed surfaces of the Ag material;
8. Form a silver chloride (AgCl) nano mask pattern overlying surfaces of the base regions and hexagonal pyramid structures;
9. Perform a dry etching process using chlorine bearing plasma through the mask regions that expose GaN material to form a plurality of nanodot patterns on the exposed GaN material;
10. Remove the mask and releasing any AgCl residual material;
11. Yield a nanodot patterned GaN substrate, as shown; and
12. Perform other processes on the nanodot patterned GaN.

As shown, the above sequence of steps provides a method of forming a combination of hexagonal pyramid structures configured with a plurality of nanodot patterns, e.g., nano particles, on a gallium and nitrogen containing substrate member. The sequence of steps is illustrated by way of the specification and drawings. In particular, FIGS. 15 to 24 are simplified diagrams illustrating a method of fabricating a structure for light trapping configured on an optical device according to an example of the present invention.

Figure 15:
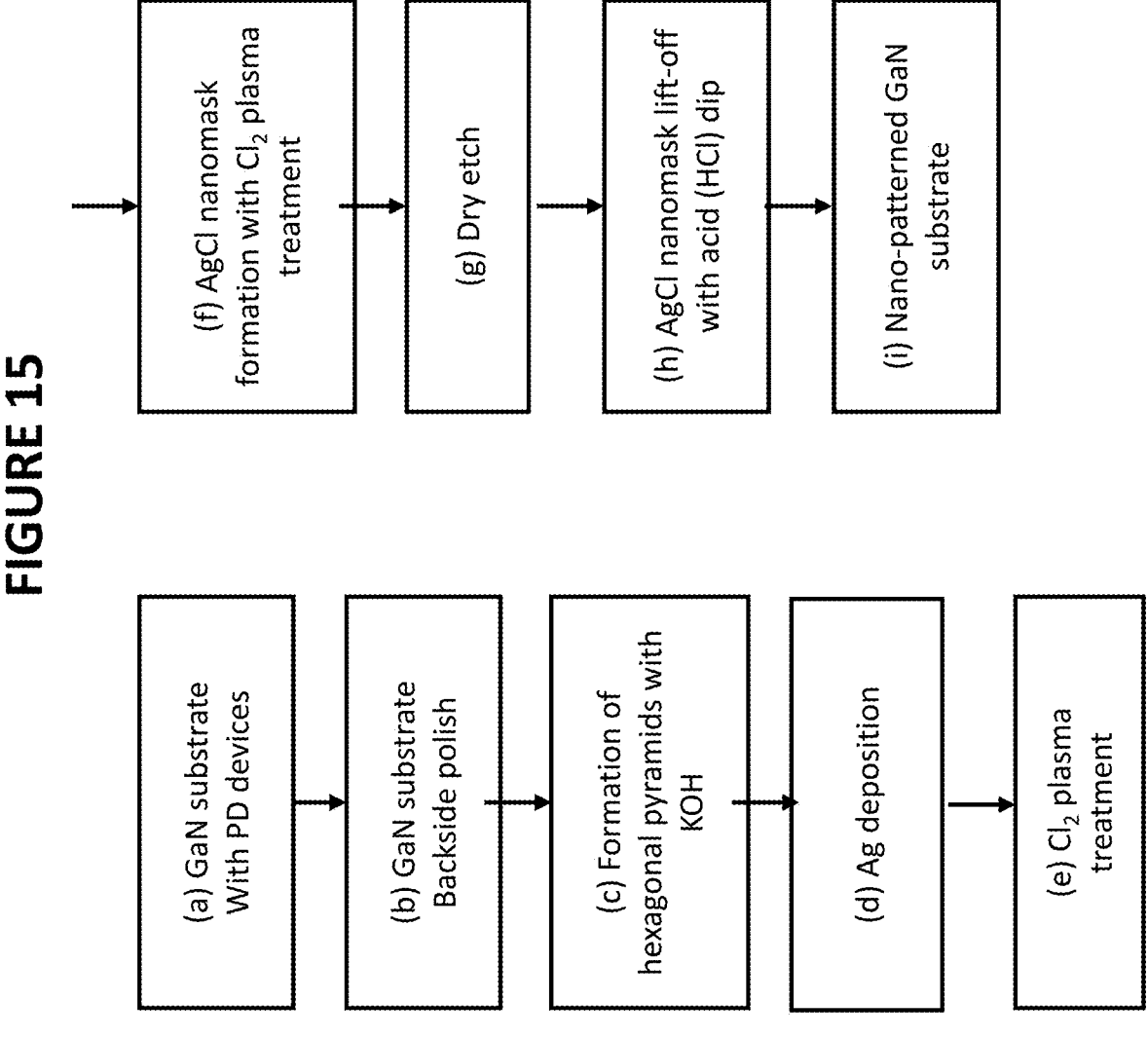

FIG. 15 is a simplified diagram of a process flow used to create nanodots using AgCl nanodot masks on the surface with hexagonal pyramid structures. The generic flow includes providing a substrate member, e.g., a GaN substrate. The GaN substrate has a plurality of devices, e.g., photodiode devices, including backside and frontside. In an example, the flow includes polishing a backside of the GaN substrate using chemical and/or mechanical polishing. In an example, the polishing is performed using a combination of slurry and chemical species.

In an example, the flow includes forming a plurality of hexagonal pyramid structures using selective etching of potassium hydroxide (KOH) etchant to selectively form the hexagonal pyramid structures using preferential etching. That is, the selective etching uses a wet process with a solution of KOH, which selectively removes a portion of GaN along crystalline boundaries to create the hexagonal pyramid structures. In an example, the flow exposes the plurality of hexagonal pyramid structures, including base regions, and hexagonal pyramid structures, as further shown below.

In an example, the flow forms a nano mask pattern overlying surfaces of the base regions and hexagonal pyramid structures. The nano mask pattern blocks portions of the surface regions of the hexagonal pyramid structures and base regions. In an example, the flow performs a dry etching process through the mask regions that expose GaN material to form a plurality of nanodot patterns on the exposed GaN material. The flow removes the mask and produces a nanodot patterned on the GaN substrate, as shown. Of course, the flow also includes other processes on the nano patterned GaN. Further details of the flow are described according to the drawings and specification below.

Figure 16:
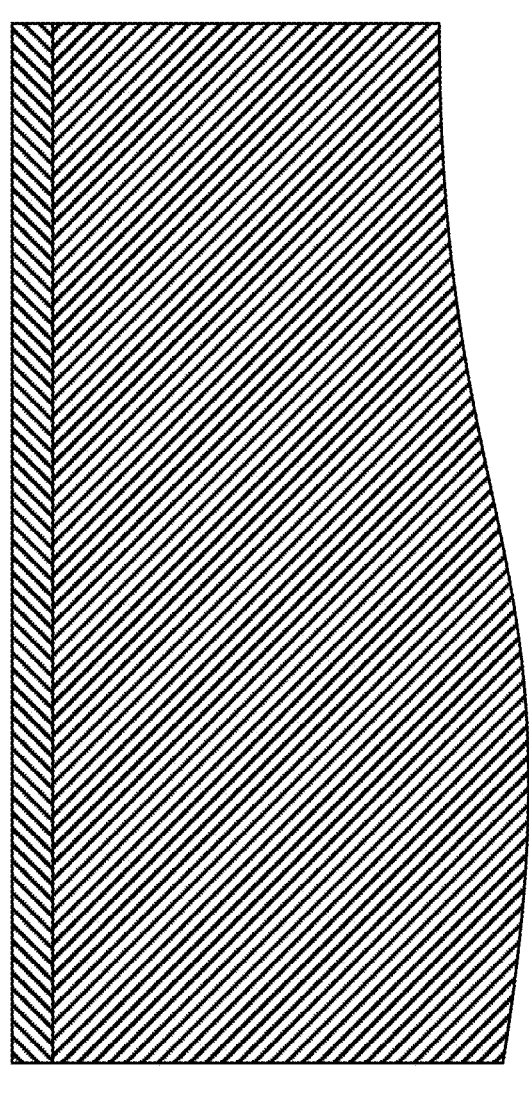
Figure 17:
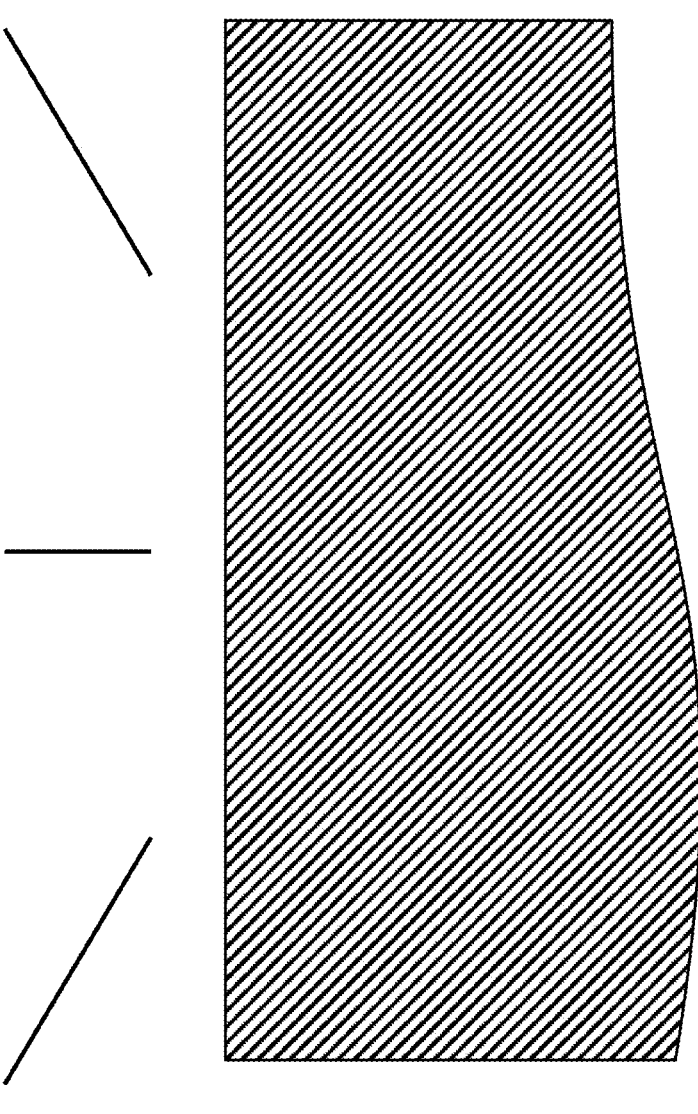
Figure 18:
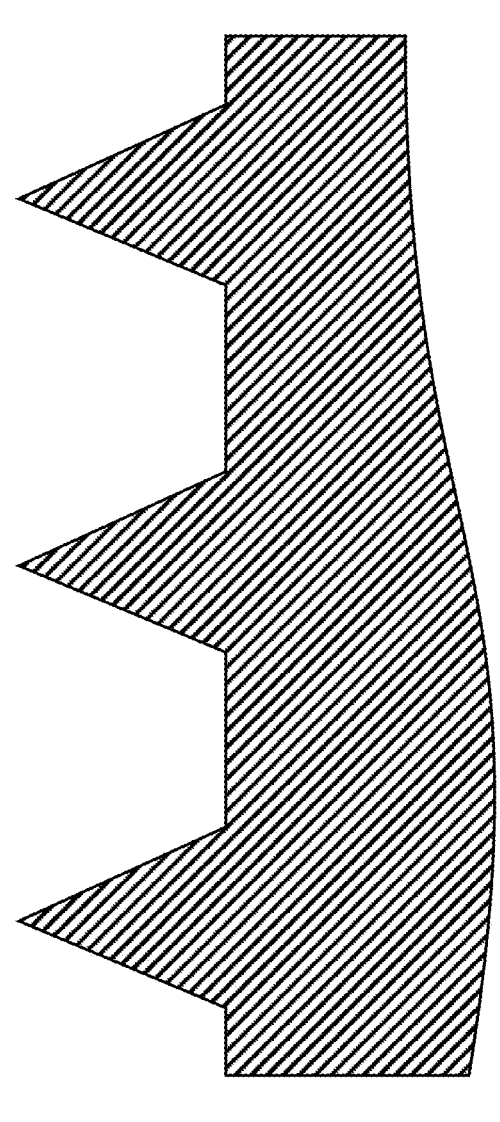

FIG. 16 is a simplified diagram of the backside of a GaN substrate with a layer of material that needs to be removed through the polishing process. FIG. 17 is a simplified diagram of a polished surface where the material thickness shown in FIG. 16 has been removed during the polishing step. FIG. 18 is a simplified diagram of hexagonal pyramid structures and flat area between the pyramid structures formed on the polished surface through wet etching using KOH solution.

Figure 19:
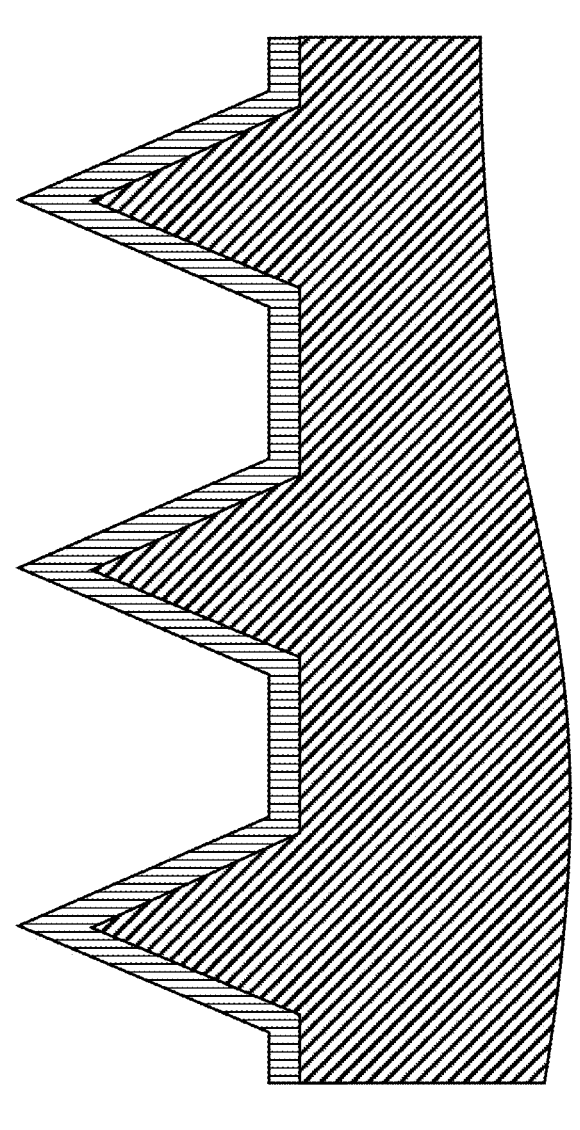

FIG. 19 is a simplified diagram of the surface of hexagonal pyramid structures and flat area between the pyramid structures covered by Ag layer deposited through a metal deposition process. In an example, a method forms a silver (Ag) material using a deposition process, as shown. The silver can be deposited or spluttered depending upon the example.

Figure 20:
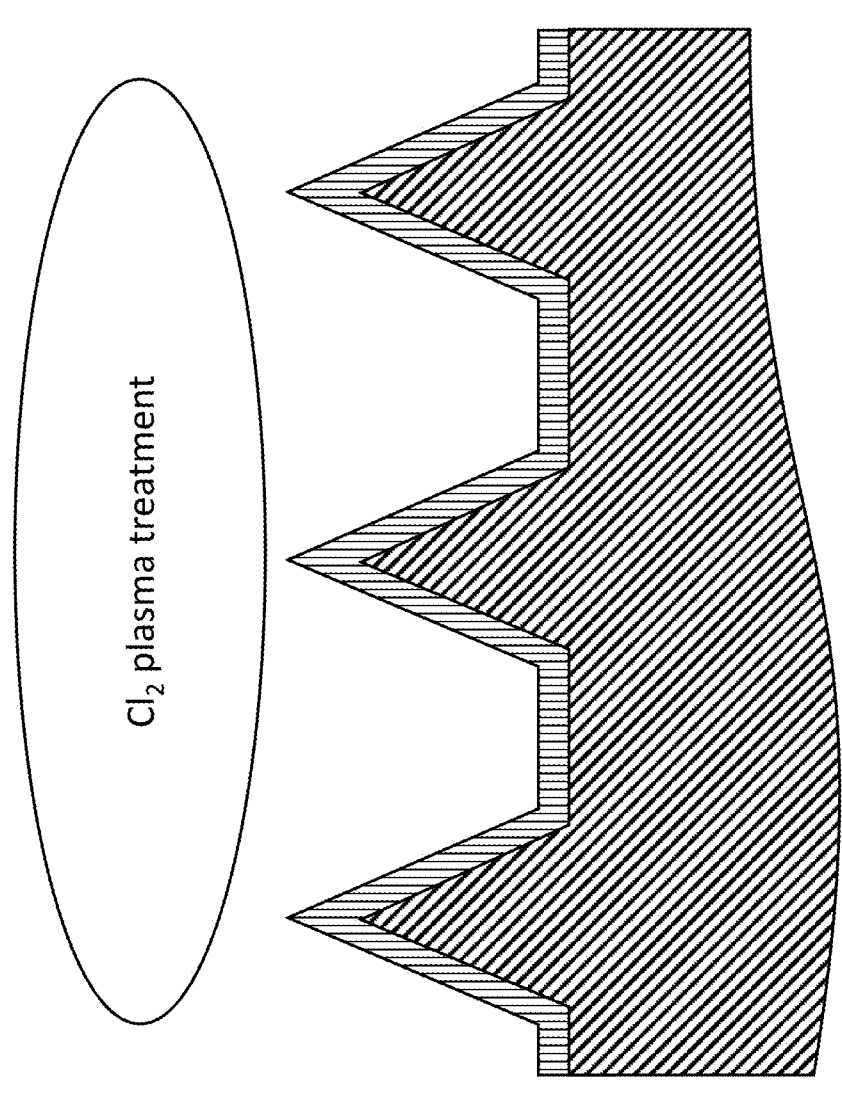

FIG. 20 is a simplified diagram of $Cl_2$ plasma treatment to be performed on the Ag surface to form AgCl nanodots. In an example, the method performs a chlorine plasma treatment process on exposed surfaces of the Ag material.

Figure 21:
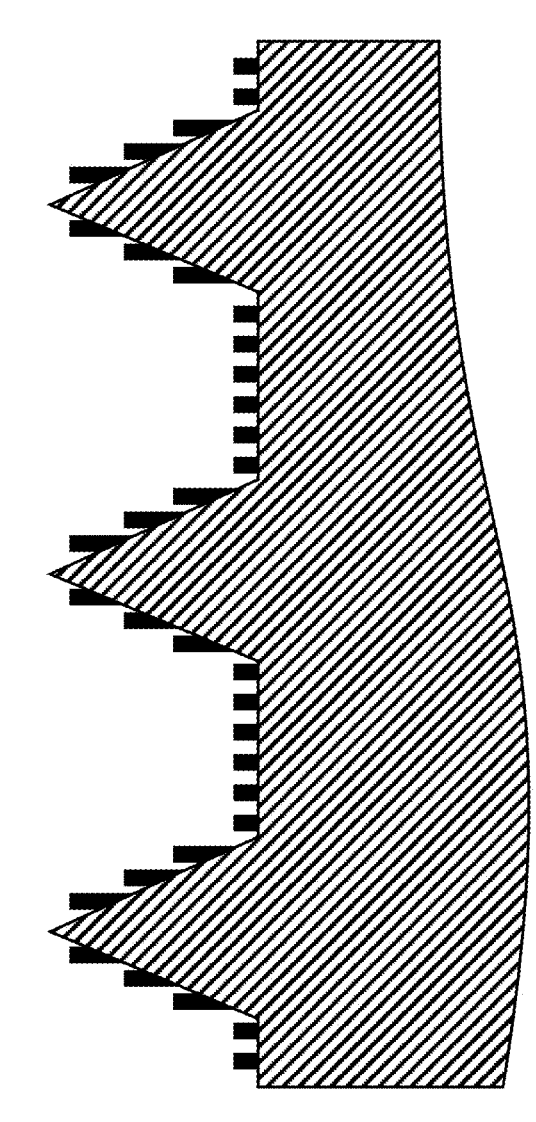

FIG. 21 is a simplified diagram of the resulting silver chloride nanodots formed on the surface of hexagonal pyramid structures and flat area between the pyramid structures from the $Cl_2$ plasma treatment depicted in FIG. 20. In an example, the method forms a silver chloride (AgCl) nano mask pattern overlying surfaces of the base regions and hexagonal pyramid structures.

Figure 22:
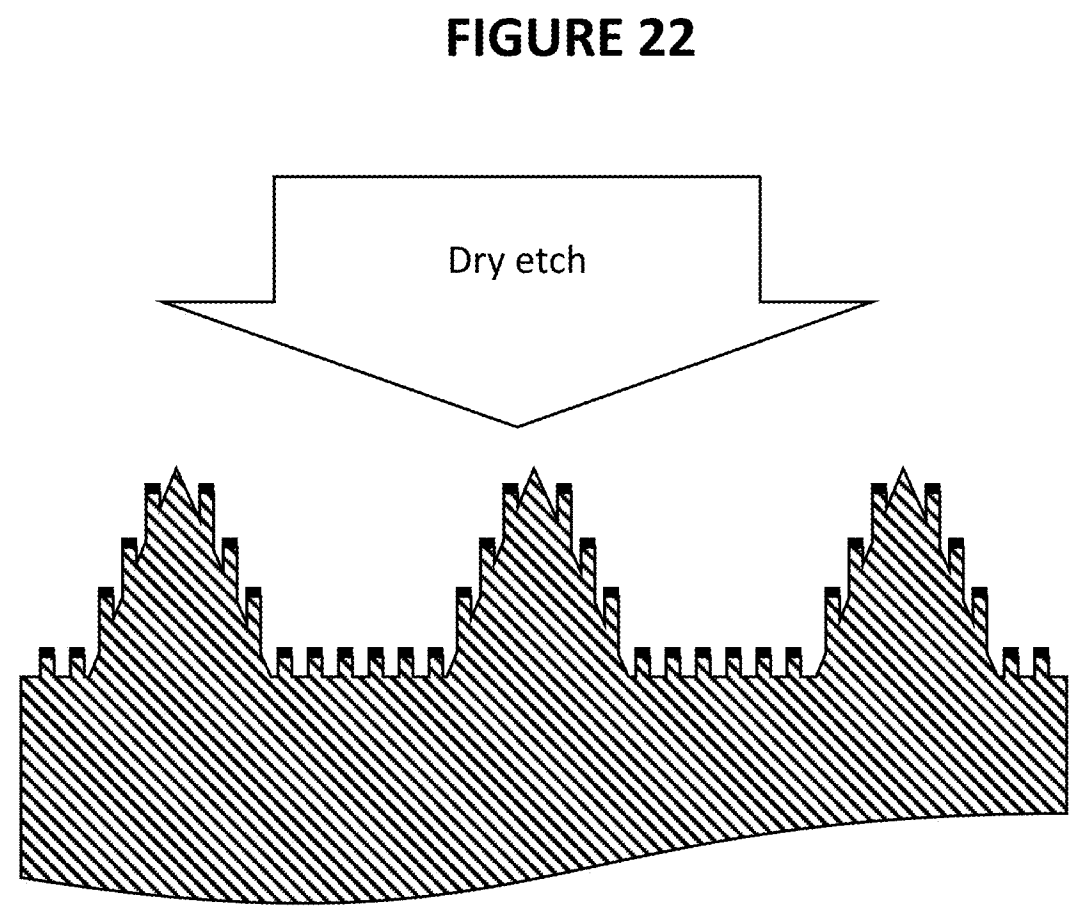
Figure 23:
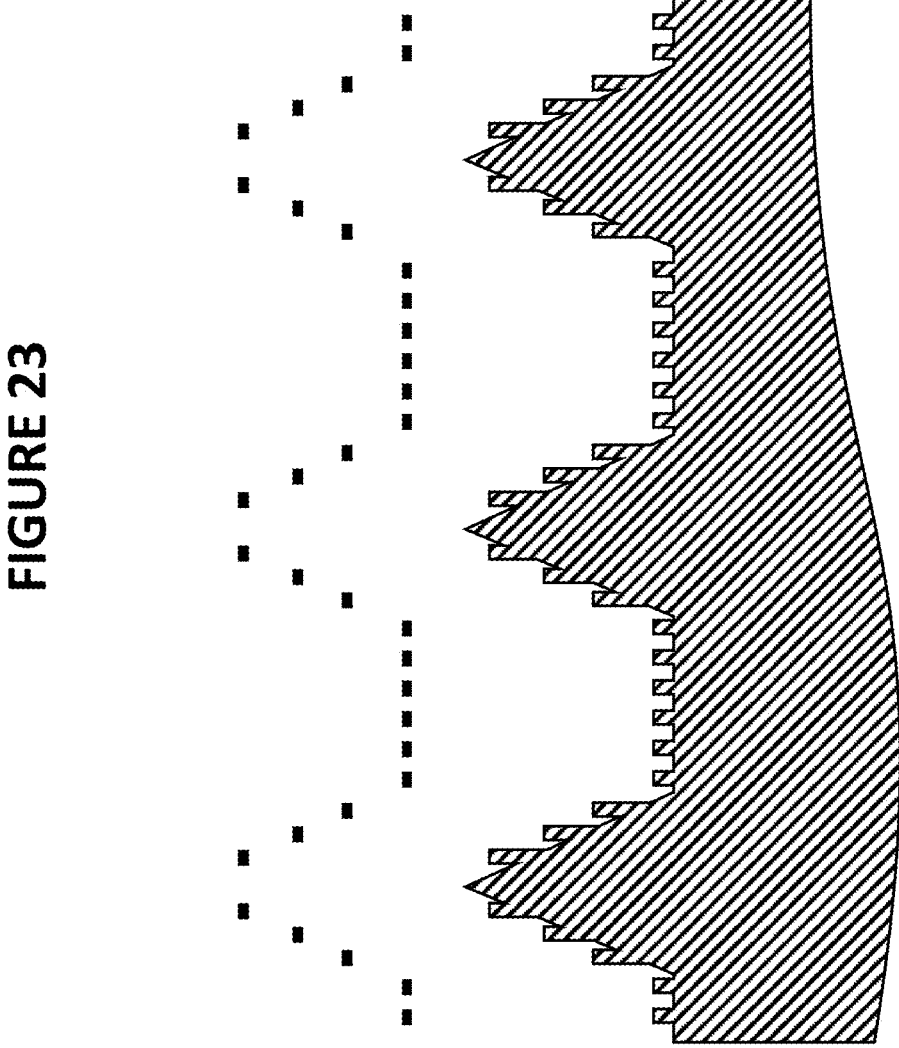
Figure 24:
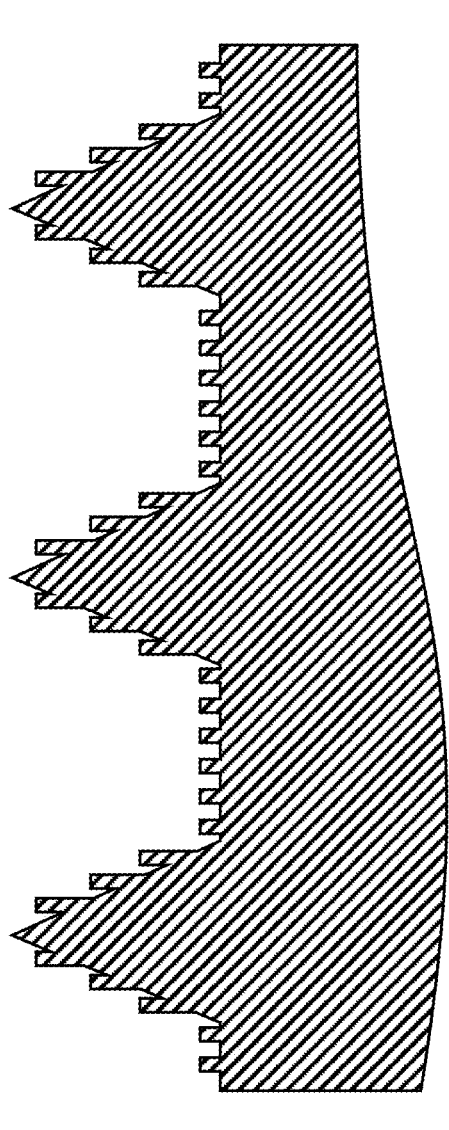

FIG. 22 is a simplified diagram of the dry etch process used to create nanodots as defined by the AgCl nanodot masks. In an example, the method performs a dry etching process using chlorine bearing plasma through the mask regions that expose GaN material to form a plurality of nanodot patterns on the exposed GaN material. FIG. 23 is a simplified diagram of the mask removal process by hydrochloric acid (HCl) dip. FIG. 24 is a simplified diagram of the resulting backside surface obtained as a result of the process described in FIGS. 15-23.

Figure 25:
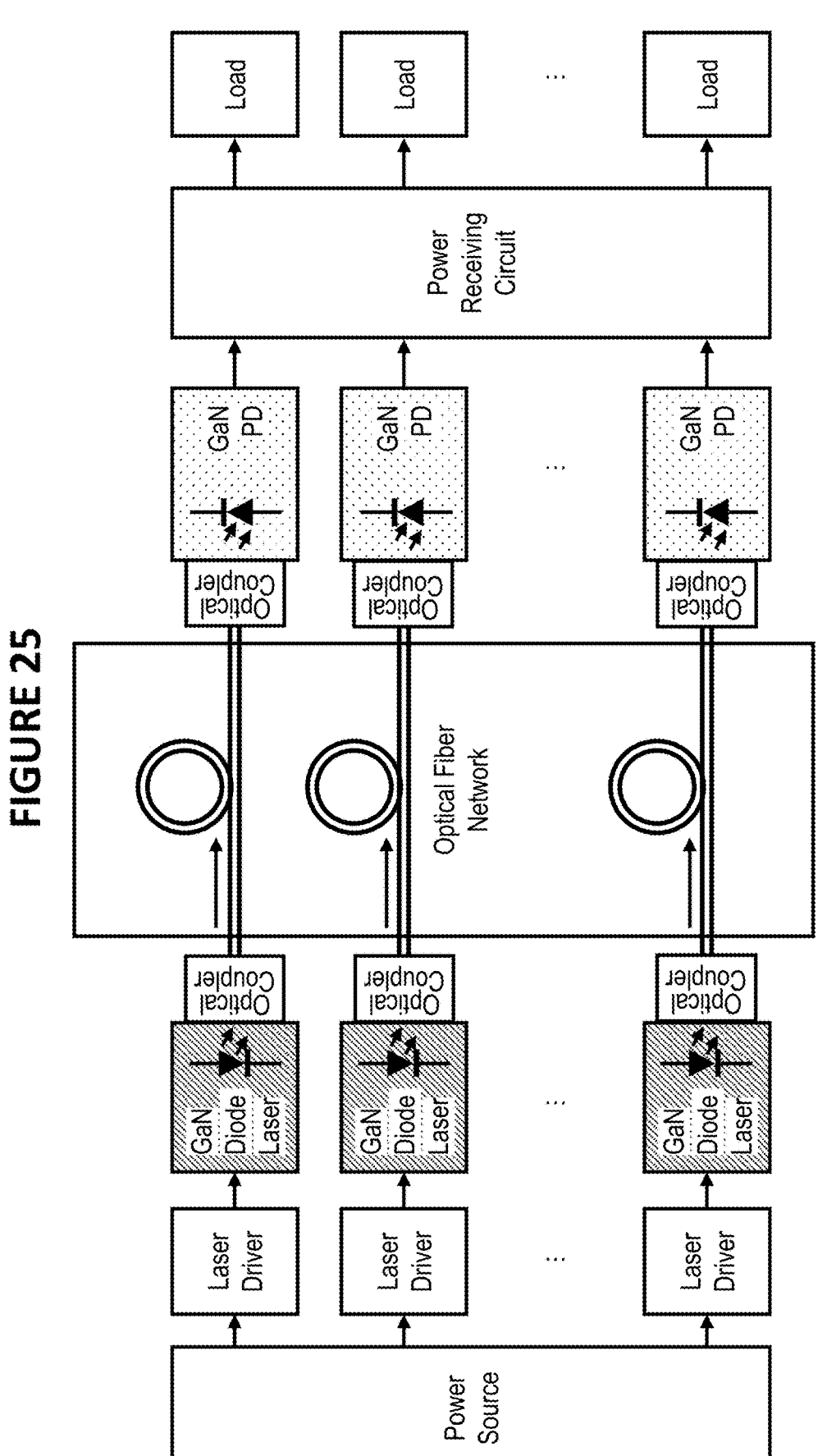
FIG. 25 is a simplified diagram of a power over fiber system configured with photodiode devices according to an example of the present invention.

FIG. 25 is a simplified diagram of a power over fiber system configured with photodiode devices according to an example of the present invention. As shown, a power over fiber (PoF) system is a technology that delivers power and data signals over a single optical fiber. In such a system, a plurality of laser drivers are used to power lasers, which are coupled to an optical coupler that connects to a fiber. The fiber is configured in an optical fiber network. In an example, the fiber then transmits the optical power signal to a receiver end, where it is detected by a photodiode device and processed by a readout circuit. The readout circuit determines a load, as shown.

In an example, the laser drivers in a PoF system are used to modulate the power output of the lasers, which is then transmitted over the optical fiber. The laser drivers typically receive power from an external power source, such as a battery or a power supply. The lasers are designed to operate at specific wavelengths that are optimized for efficient transmission over optical fibers.

At the receiver end of the fiber, the optical power signal is detected by a photodiode device, which converts the optical signal into an electrical signal. The readout circuit then processes the electrical signal and extracts the data that was transmitted over the fiber. The readout circuit also provides power to the photodiode device.

Overall, a PoF system can be used for a variety of applications, such as remote sensing, distributed power generation, and wireless communication. The system offers several advantages over traditional electrical power and data transmission systems, including high reliability, low electromagnetic interference, and reduced maintenance costs.

In an example, the present invention provides an optical device, e.g., photodiode device. The device has a gallium and nitrogen containing substrate member having a backside surface and an upper surface. The device has an N-type gallium and nitrogen containing material having a silicon dopant overlying the upper surface. The N-type gallium and nitrogen containing material is configured as a buffer material. The buffer material has a thickness ranging from about 0.5 micrometer to one and a half micrometer.

In an example, the device has a super lattice (SL) indium gallium nitrogen containing material overlying the N-type gallium and nitrogen containing material. The super lattice layer comprises an indium gallium nitrogen containing material and a gallium and nitrogen containing material. The super lattice material is a periodic structure having fifteen to eighty indium gallium nitrogen containing material and the gallium and nitrogen containing material.

In an example, the device has a lower barrier (LB) indium gallium nitrogen containing material overlying the SL indium gallium nitrogen containing material. The LB material has an indium concentration ranging from zero to four percent. The LB material has a thickness ranging from 6 to 14 nanometers.

In an example, the device has a plurality of quantum well regions ranging from 30 to 70 quantum wells overlying the LB indium gallium nitrogen containing material. Each of the quantum wells has an indium gallium nitride material having a thickness of 2.0 nanometers to 4.0 nanometers, and an indium concentration ranging from ten percent to 14 percent, and a gallium nitride material having a thickness of 1.0 nanometers to 2.5 nanometers. In an example, the plurality of quantum well regions are in an undoped state.

In an example, the device has an upper barrier (UB 1) material overlying the plurality of quantum well regions. The upper barrier material (UB1) comprises a gallium and nitrogen containing material and/or an indium and gallium nitrogen containing material. The upper barrier material is characterized by a potential barrier configured as an abrupt or a graded or a combination of an abrupt and a graded potential barrier such that the graded potential barrier of the upper barrier material is characterized by a composition of indium species ranging from 2% to 13%. In an example, the upper barrier material is in an undoped state.

In an example, the device has an upper barrier (UB 2) indium gallium nitrogen containing material overlying the UB1 layer. The upper barrier gallium nitrogen containing material comprises a magnesium dopant material having a concentration 8E19 atoms/cm$^3$ to 6E20 atoms/cm$^3$, and a thickness of sixteen nanometers to twenty-four nanometers. In an example, the device has a P-type gallium and nitrogen containing material overlying the UB 2 indium gallium nitrogen containing material. The P-type material is a cap material. In an example, the device has a P-type contact comprising gallium and nitrogen material having a magnesium dopant material. The P-type contact is in electrical and physical contact with the P-type gallium and nitrogen containing material.

In an example, the silicon dopant of buffer layer comprises a concentration ranging from 1E18 atoms/cm$^3$ to 8E18 atoms/cm$^3$. In an example, the SL indium gallium nitrogen containing material comprises a silicon dopant having a concentration ranging from 1E18 to 5E18 atoms/cm$^3$.

In an example, the LB indium gallium nitrogen containing material comprises a silicon dopant having a concentration ranging from 1E19 to 5E19 atoms/cm$^3$, with indium composition ranging from zero to 4 percent. In an example, each of the quantum well regions comprise multiple quantum well regions.

In an example, the upper and/or lower barrier material and/or the quantum well regions are subjected to an in-situ anneal step under NH$_3$ post barrier growth. In an example, the anneal step improves a device open circuit voltage and a fill factor, which in turn increases an optical power conversion efficiency of the photodiode. Additionally, an anneal step allows for an increase in the number of quantum wells, resulting in higher photocurrent and overall device efficiency when compared to a process not having an anneal step.

In an example, the backside surface is an aperture region.

In an example, the device further comprises a first metal material connected to the P-type contact and a second metal material connect to the N-type gallium and nitrogen containing material.

In an example, the gallium and nitrogen containing substrate having the upper surface with a miscut ranging from 0.2 to 1 Degree towards the m-plane axis.

In an example, the device is configured to detect an electromagnetic laser radiation of wavelength of 390 to 460 nanometers.

In an example, the device is configured to detect an electromagnetic signal from a laser device and convert an optical energy from the electromagnetic signal into an electrical energy. In an example, the device is characterized by a varying optical-electrical power conversion efficiency dependent upon a design of a multiple quantum well region and a back side roughening characteristic.

In an example, the device is characterized by a high-power conversion efficiency of up to 65% for a laser input power of ~0.4 Watt.

In an example, the invention provides a photo diode or a photodetector device. The device has a gallium and nitrogen containing substrate member having a backside surface and an upper surface and an N-type gallium and nitrogen containing material having a silicon dopant overlying the upper surface. The N-type gallium and nitrogen containing material is configured as a buffer material. The buffer material has a thickness ranging from about 0.5 micrometer to one and a half micrometer. The device has a super lattice (SL) indium gallium nitrogen containing material overlying the N-type gallium and nitrogen containing material. The super lattice layer comprises an indium gallium nitrogen containing material and a gallium and nitrogen containing material. The super lattice material has twenty-five to eighty indium gallium nitrogen containing material and the gallium and nitrogen containing material. The device has a lower barrier (LB) indium gallium nitrogen containing material overlying the SL indium gallium nitrogen containing material. The LB material has an indium concentration ranging from zero to four percent. The LB material has a thickness ranging from 8 to 12 nanometers.

In an example, the device has a plurality of quantum well regions ranging from 30 to 50 quantum wells overlying the LB indium gallium nitrogen containing material. Each of the quantum wells has an indium gallium nitride material having a thickness of 2.5 nanometers to 3.5 nanometers and an indium concentration ranging from seven percent to 14 percent, and a gallium nitride material having a thickness of 1.5 nanometers to 2.5 nanometers. In an example, the plurality of quantum well regions are in an undoped state.

In an example, the device has an upper barrier (UB 1) indium gallium nitrogen containing material overlying the plurality of quantum well regions. The indium gallium nitride has a concentration ranging from zero to four percent, and a thickness of 4 nanometers to 10 nanometers. The upper barrier material is in an undoped state.

In an example, the device has an upper barrier (UB 2) gallium nitrogen containing material overlying the UB 1 layer. The upper barrier gallium nitrogen containing material comprising a magnesium dopant material having a concentration $8E19$ atoms/cm$^3$ to $6E10$ atoms/cm$^3$, and a thickness of sixteen nanometers to twenty-four nanometers. The device has a P-type gallium and nitrogen containing material overlying the UB 2 indium gallium nitrogen containing material, the P-type material being a cap material and a P-type contact comprising gallium and nitrogen material having a magnesium dopant material. The P-type contact is in electrical and physical contact with the P-type gallium and nitrogen containing material.

In an example, the silicon dopant comprises a concentration ranging from $1E18$ atoms/cm$^3$ to $8E18$ atoms/cm$^3$.

In an example, the SL indium gallium nitrogen containing material comprises a silicon dopant having a concentration ranging from $1E18$ to $5E18$ atoms/cm$^3$. In an example, the LB indium gallium nitrogen containing material comprises a silicon dopant having a concentration ranging from $1E19$ to $5E19$ atoms/cm$^3$. In an example, each of the quantum well regions comprise multiple quantum well regions. In an example, the backside surface is an aperture region.

In an example, the device further comprises a first metal material connected to the P-type contact and a second metal material connect to the N-type gallium and nitrogen containing material.

In an example, the gallium and nitrogen containing substrate having the upper surface with a miscut ranging from 0.2 to 1 Degree an m-plane axis.

In an example, the invention provides an alternative optical device. The device has a gallium and nitrogen containing substrate member having a backside surface and an upper surface and an active region comprising a plurality of quantum well regions overlying the upper surface. In an example, the device has a plurality of hexagonal shaped pyramid structures spatially disposed along the backside surface. Each of the hexagonal shaped pyramid structures has a height ranging from about 0.3 micrometer to about 30 micrometers, and a base ranging from about 0.3 micrometer to 30 micrometer. Each of the hexagonal shaped pyramid structures extends from a crystalline structure of the gallium and nitrogen containing substrate member and has an irregularity in size ranging from 0% to 50%.

In an example, the device has an interior region disposed between a pair of the plurality of hexagonal shaped pyramid structures and a plurality of nanodots spatially disposed overlying the interior region and overlying a surface region of each of the hexagonal shaped pyramid structures and configured to direct electromagnetic radiation having a wavelength ranging from 390 to 450 nanometers the active region to increase an absorption of the radiation into the active region, and thereby coupling additional radiation into the active region.

In an example, the plurality of hexagonal shaped pyramid structures comprises 50% to 100% of the backside surface, and the interior region comprises 50% to 100% of the backside surface. In an example, the plurality of hexagonal shaped pyramid structures is provided using a potassium hydroxide KOH etchant.

In an example, the plurality of nanodots comprises a size ranging in a nanoscale. In an example, the plurality of nanodots comprises a gallium nitride material and each of the nanodots having a feature size and a shape.

In an example, the electromagnetic radiation is derived from laser irradiation. In an example, the electromagnetic radiation comprising laser radiation enters the substrate member through the backside surface or a side edge of the substrate member. In an example, the electromagnetic radiation has a wavelength of 390 to 450 nanometers.

In an example, the device further comprises a power conversion efficiency (PCE) ranging from 50 to 85 percent.

In an example, the device further comprises a light trapping region comprising the plurality of hexagonal shaped structures and the plurality of nanodots.

In an example, the device further has a light trapping region comprising the plurality of hexagonal shaped structures and the plurality of nanodots is configured to maintain the electromagnetic radiation within the device and is configured as a light trapping cavity to prevent electromagnetic radiation from escaping the device. In an example, the device has a high reflectivity mirror coating overlying a light trapping region comprising a portion of the plurality of hexagonal shaped pyramid structure and a portion of the plurality of nanodots to enhance light trapping and prevent light escaping.

In an example, the plurality of nanodots overlying the hexagonal pyramids and interior area are configured to scatter an escaping electromagnetic radiation back to the device resulting in spatially uniform light absorption over a substantial area of the active regions.

In an example, the backside surface comprises the nanodots and the hexagonal shaped pyramid structures provides a non-abrupt change of a reflective index within a vicinity of a surface to improve or maximize a transmission of an incident laser radiation into the device and minimize or reduce a reflection back to an ambient space outside of the device.

In an example, the backside surface comprising the nanodots and the hexagonal shaped pyramid structures is configured to scatter an incident laser radiation into multiple directions to cause in an enhanced light transmission at an incident surface.

In an example, the invention provides an alternative photo diode device. The device has a gallium and nitrogen containing substrate member having a backside surface and an upper surface and an active region comprising a plurality of quantum well regions overlying the upper surface. In an example, the device has a plurality of hexagonal shaped pyramid structures spatially disposed along the backside surface. Each of the hexagonal shaped pyramid structures has a height ranging from about 0.3 micrometer to about 30 micrometers, and a base ranging from about 0.3 micrometer to 30 micrometer. Each of the hexagonal shaped pyramid structures extends from a crystalline structure of the gallium and nitrogen containing substrate member and has an irregularity in size ranging from 0% to 50%. The device has an interior region disposed between a pair of the plurality of hexagonal shaped pyramid structures. The device has a plurality of nanodots spatially disposed overlying the interior region and overlying a surface region of each of the hexagonal shaped pyramid structures and configured to direct electromagnetic radiation having a wavelength ranging from 390 to 450 nanometers the active region to increase an absorption of the radiation into the active region, and thereby coupling additional radiation into the active region.

In an example, the plurality of hexagonal shaped pyramid structures comprises 50% to 100% of the backside surface, and the interior region comprises 50% to 100% of the backside surface. In an example, the plurality of hexagonal shaped pyramid structures is provided using a potassium hydroxide KOH etchant.

In an example, the plurality of nanodots comprises a size ranging in a. nanoscale. In an example, the plurality of nanodots comprises a gallium nitride material and each of the nanodots having a feature size and a shape.

In an example, the electromagnetic radiation is derived from laser irradiation. In an example, the electromagnetic radiation comprising laser radiation enters the substrate member through the backside surface or a side edge of the substrate member. In an example, the electromagnetic radiation has a wavelength of 390 to 450 nanometers.

In an example, the device has a power conversion efficiency (PCE) ranging from 50 to 85 percent.

In an example, the device has a light trapping region comprising the plurality of hexagonal shaped structures and the plurality of nanodots. In an example, the device has a light trapping region comprising the plurality of hexagonal shaped structures and the plurality of nanodots is configured to maintain the electromagnetic radiation within the device and is configured as a light trapping cavity to prevent electromagnetic radiation from escaping the device.

In an example, the device has a high reflectivity mirror coating overlying a light trapping region comprising a portion of the plurality of hexagonal shaped pyramid structure and a portion of the plurality of nanodots to enhance light trapping and prevent light escaping. In an example, the plurality of nanodots overlying the hexagonal pyramids and interior area is configured to scatter an escaping electromagnetic radiation back to the device resulting in spatially uniform light absorption over a substantial area of the active regions.

In an example, the backside surface comprising the nanodots and the hexagonal shaped pyramid structures provides a non-abrupt change of a reflective index within a vicinity of a surface to improve or maximize a transmission of an incident laser radiation into the device and minimize or reduce a reflection back to an ambient space outside of the device. In an example, the backside surface comprising the nanodots and the hexagonal shaped pyramid structures is configured to scatter an incident laser radiation into multiple directions to cause in an enhanced light transmission at an incident surface.

In an example, the present invention provides a power converter device. The device has a laser device configured to emit electromagnetic energy as a laser beam and a fiber optical cable configured to receive the laser beam. The device has a photodiode device coupled to receive the laser beam and convert the laser beam into electrical energy.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
a gallium and nitrogen containing substrate member having a backside surface and an upper surface;
an N-type gallium and nitrogen containing material having a silicon dopant overlying the upper surface, the N-type gallium and nitrogen containing material being configured as a buffer material, the buffer material having a thickness ranging from 0.5 micrometer to one and a half micrometers;
a super lattice (SL) indium gallium nitrogen containing material overlying the N-type gallium and nitrogen containing material, the super lattice material comprising an indium gallium nitrogen containing material and a gallium and nitrogen containing material, the super lattice material having fifteen to eighty layers of the indium gallium nitrogen containing material and the gallium and nitrogen containing material;
a lower barrier (LB) indium gallium nitrogen containing material overlying the SL indium gallium nitrogen containing material, the LB material having an indium concentration ranging from greater than zero to four percent, the LB material having a thickness ranging from 6 to 14 nanometers;
a plurality of quantum well regions ranging from 30 to 70 quantum wells overlying the LB material, each of the quantum wells having an indium gallium nitride material having a thickness of 2.0 nanometers to 4.0 nanometers, and an indium concentration ranging from seven percent to 14 percent, and a gallium nitride material having a thickness of 1.0 nanometers to 2.5 nanometers, the plurality of quantum well regions being an undoped state;
an upper barrier (UB 1) material overlying the plurality of quantum well regions, the upper barrier (UB 1) material comprising a gallium and nitrogen containing material and/or an indium and gallium nitrogen containing material, the upper barrier (UB 1) material being in an undoped state;
an upper barrier (UB 2) gallium nitrogen containing material overlying the upper barrier (UB 1) material, the upper barrier (UB 2) gallium nitrogen containing material comprising a magnesium dopant material having a concentration 8E19 atoms/cm$^3$ to 6E20 atoms/cm$^3$, and a thickness of sixteen nanometers to twenty-four nanometers;
a P-type gallium and nitrogen containing material overlying the upper barrier (UB 2) gallium nitrogen containing material, the P-type material being a cap material; and
a P-type contact comprising gallium and nitrogen material having a magnesium dopant material, the P-type contact being in electrical and physical contact with the P-type material.

2. The device of claim 1 wherein the buffer material comprises a silicon dopant concentration ranging from 1E18 atoms/cm$^3$ to 8E18 atoms/cm$^3$.

3. The device of claim 1 wherein the super lattice material comprises a silicon dopant having a concentration ranging from 1E18 to 5E18 atoms/cm$^3$.

4. The device of claim 1 wherein the LB material comprises a silicon dopant having a concentration ranging from 1E19 to 5E19 atoms/cm$^3$.

5. The device of claim 1 wherein the upper barrier (UB 1) material is characterized by a potential configured as an abrupt or a graded potential.

6. The device of claim 1 wherein the graded potential of the upper barrier (UB 1) material has an indium composition ranging from 2% to 13%.

7. The device of claim 1 wherein at least one of the plurality of quantum well regions, the upper barrier (UB 1) material, or the (UB 2) gallium nitrogen containing material are subjected to an in-situ anneal process under an NH$_3$ environment.

8. The device of claim 1 wherein the backside surface is an aperture region.

9. The device of claim 1 further comprising a first metal material connected to the P-type contact and a second metal material connect to the N-type gallium and nitrogen containing material.

10. The device of claim 1 wherein the gallium and nitrogen containing substrate member has the upper surface with a miscut ranging from 0.2 to 1 Degree towards an m-plane axis.

11. The device of claim 1 configured to output an electromagnetic laser radiation having a wavelength of 390 to 460 nanometers.

12. The device of claim 1 wherein the device is configured to detect an electromagnetic signal from a laser device and convert an optical energy from the electromagnetic signal into an electrical energy.

13. The device of claim 1 wherein the device is characterized by a varying optical-electrical power conversion efficiency dependent upon the plurality of quantum well regions and a back side roughening characteristic.

14. The device of claim 1 wherein the device is characterized by a high-power conversion efficiency of up to 65% for a laser input power of ~0.4 Watt.

15. A photo diode or a photodetector device comprising:
a gallium and nitrogen containing substrate member having a backside surface and an upper surface;
an N-type gallium and nitrogen containing material having a silicon dopant overlying the upper surface, the N-type gallium and nitrogen containing material being configured as a buffer material, the buffer material having a thickness ranging from 0.5 micrometer to one and a half micrometer;
a super lattice (SL) indium gallium nitrogen containing material overlying the N-type gallium and nitrogen containing material, the super lattice material comprising an indium gallium nitrogen containing material and a gallium and nitrogen containing material, the super lattice material having twenty-five to eighty layers of the indium gallium nitrogen containing material and the gallium and nitrogen containing material;
a lower barrier (LB) indium gallium nitrogen containing material overlying the SL indium gallium nitrogen containing material, the LB material having an indium concentration ranging from greater than zero to four percent, the LB material having a thickness ranging from 8 to 12 nanometers;
a plurality of quantum well regions ranging from 30 to 50 quantum wells overlying the LB material, each of the quantum wells having an indium gallium nitride material having a thickness of 2.5 nanometers to 3.5 nanometers, and an indium concentration ranging from ten percent to 14 percent, and a gallium nitride material having a thickness of 1.5 nanometers to 2.5 nanometers, the plurality of quantum well regions being an undoped state;
an upper barrier (UB 1) indium gallium nitrogen containing material overlying the plurality of quantum well regions, the indium gallium nitrogen containing material having an indium concentration ranging from greater than zero to four percent, and a thickness of 4 nanometers to 10 nanometers, the upper barrier (UB 1) indium gallium nitrogen containing material being in an undoped state;
an upper barrier (UB 2) gallium nitrogen containing material overlying the upper barrier (UB 1) indium gallium nitrogen containing material, the upper barrier (UB 2) gallium nitrogen containing material comprising a magnesium dopant material having a concentration 8E19 atoms/cm$^3$ to 6E20 atoms/cm$^3$, and a thickness of sixteen nanometers to twenty-four nanometers;
a P-type gallium and nitrogen containing material overlying the (UB 2) gallium nitrogen containing material, the P-type material being a cap material; and
a P-type contact comprising gallium and nitrogen material having a magnesium dopant material, the P-type contact being in electrical and physical contact with the P-type material.

16. The device of claim 15 wherein the super lattice material comprises a silicon dopant having a concentration ranging from 1E18 to 5E18 atoms/cm$^3$.

17. The device of claim 15 wherein the LB material comprises a silicon dopant having a concentration ranging from 1E19 to 5E19 atoms/cm$^3$; and
wherein the backside surface is an aperture region.

18. The device of claim 15 further comprising a first metal material connected to the P-type contact and a second metal material connect to the N-type gallium and nitrogen containing material.

19. A power converter device comprising:
a laser device configured to emit electromagnetic energy as a laser beam;
a fiber optical cable configured to receive the laser beam; and a photodiode device coupled to receive the laser beam and convert the laser beam into electrical energy, the photodiode device comprising:
a gallium and nitrogen containing substrate member having a backside surface and an upper surface;
an N-type gallium and nitrogen containing material having a silicon dopant overlying the upper surface, the N-type gallium and nitrogen containing material being configured as a buffer material, the buffer material having a thickness ranging from 0.5 micrometer to one and a half micrometer;
a super lattice (SL) indium gallium nitrogen containing material overlying the N-type gallium and nitrogen containing material, the super lattice material comprising an indium gallium nitrogen containing material and a gallium and nitrogen containing material, the super lattice material is a periodic structure having fifteen to eighty layers of the indium gallium nitrogen containing material and the gallium and nitrogen containing material;
a lower barrier (LB) indium gallium nitrogen containing material overlying the SL indium gallium nitrogen containing material, the LB material having an indium concentration ranging from greater than zero to four percent, the LB material having a thickness ranging from 6 to 14 nanometers;

a plurality of quantum well regions ranging from 30 to 70 quantum wells overlying the LB material, each of the quantum wells having an indium gallium nitride material having a thickness of 2.0 nanometers to 4.0 nanometers, and an indium concentration ranging from ten percent to 14 percent, and a gallium nitride material having a thickness of 1.0 nanometers to 2.5 nanometers, the plurality of quantum well regions being an undoped state;

an upper barrier (UB 1) material overlying the plurality of quantum well regions, the upper barrier (UB1) material comprising a gallium and nitrogen containing material and/or an indium and gallium nitrogen containing material, the upper barrier (UB 1) material being in an undoped state;

an upper barrier (UB 2) indium gallium nitrogen containing material overlying the upper barrier (UB1) material, the upper barrier (UB 2) indium gallium nitrogen containing material comprising a magnesium dopant material having a concentration 8E19 atoms/cm$^3$ to 6E20 atoms/cm$^3$, and a thickness of sixteen nanometers to twenty-four nanometers;

a P-type gallium and nitrogen containing material overlying the upper barrier (UB 2) indium gallium nitrogen containing material, the P-type material being a cap material; and a P-type contact comprising gallium and nitrogen material having a magnesium dopant material, the P-type contact being in electrical and physical contact with the P-type material.

20. The device of claim 19 wherein the device is characterized by a high-power conversion efficiency of up to 65% for a laser input power of ~0.4 Watt.

\* \* \* \* \*